United States Patent [19]

Vinal

[11] 4,276,555
[45] Jun. 30, 1981

[54] CONTROLLED AVALANCHE VOLTAGE TRANSISTOR AND MAGNETIC SENSOR

[75] Inventor: Albert W. Vinal, Cary, N.C.

[73] Assignee: International Business Machines Corporation, Armonk, N.Y.

[21] Appl. No.: 924,489

[22] Filed: Jul. 13, 1978

[51] Int. Cl.³ .............................................. H01L 29/82
[52] U.S. Cl. ...................................... 357/13; 357/27; 357/34; 357/36; 357/86
[58] Field of Search ...................... 357/13, 23, 27, 34, 357/35, 36, 64, 36

[56] References Cited

U.S. PATENT DOCUMENTS

| | | | |
|---|---|---|---|
| 2,887,423 | 5/1959 | Beale | 357/13 |
| 3,140,438 | 7/1964 | Shockley et al. | 357/13 |
| 3,196,329 | 7/1965 | Cook et al. | 357/13 |
| 3,739,238 | 6/1973 | Hara | 357/43 |
| 3,787,717 | 1/1974 | Fischer et al. | 357/86 |
| 3,829,889 | 8/1974 | Bate | 357/23 |
| 3,990,091 | 11/1976 | Cresswell et al. | 357/64 |
| 4,053,925 | 10/1977 | Burr et al. | 357/64 |
| 4,100,561 | 7/1978 | Ollendorf | 357/43 |
| 4,131,908 | 12/1978 | Daub et al. | 357/43 |

OTHER PUBLICATIONS

Miller, "Ionization Rates . . . ", Physical Review, vol. 105, No. 4, Feb. 15 1975, pp. 1246–1249.
Wolf, *Semiconductors* (Wiley-Interscience, NY, 1971), p. 324.
Assembly Manual, Health Kit Model IO-102, Oscilloscope (Health, Benten Harbor, Mich., 1971), p. 81 & Circuit Diagram.
Sze, *Physics of Semiconductor Devices*, (Wiley-Interscience, N.Y., 1969), pp. 1–812.

*Primary Examiner*—William D. Larkins
*Attorney, Agent, or Firm*—Edward H. Duffield

[57] ABSTRACT

A heretofore undiscovered suddenly conducting avalanche voltage effect is described with relationship to a new family of hybrid transistors. The devices constructed also exhibit magnetic sensitivity. The magnetic responsiveness of such devices creates a new family of magnetic sensors which utilize magnetic modulation of the avalanche voltage produced by the new effect. New transistor structure elements are incorporated in the devices. These include an impact ionization promoter means and an intrinsic, or high resistivity, depleted base region which extends at least partially from a collector toward an emitter. Minority carrier injection efficiency control means and transportation efficiency control means are also included. The character of the base region extending between the emissive junction and the collector is carefully controlled so that the product of the ionization current multiplication factor M and an electron-hole recombination probability factor $\alpha$ is less than unity. Within limits, any specifically desired avalanche voltage can be created by controlling the characteristics of the transistor structure. This voltage may then be varied bidirectionally by magnetic fields to form a new class of magnetic sensors.

70 Claims, 32 Drawing Figures $E_2 > E_1$ $E'_0 > E_2$

CONTROLLED AVALANCHE VOLTAGE TRANSISTOR AND MAGNETIC SENSOR

DESCRIPTION

1. Technical Field

The invention relates to controlled avalanche voltage transistor structures in general and to magnetically variable controlled avalanche voltage transistors responsive to magnetic fields in particular.

2. Background Art

Avalanche breakdown is a general term descriptive of a process called impact ionization which occurs in semiconductor devices. Various transistor structures exhibit characteristic breakdown voltages and modes. However, the general trend, with the exception of the Zener breakdown diodes, is to avoid the creation of breakdown or ionization voltages in semiconductor devices. Breakdown of the general sort described is usually to be avoided because of its creation of noise, instability and non-linear operating conditions. As will be shown, however, such effects can be controlled or eliminated.

A variety of semiconductive magnetic sensors are also known. There are, however, no presently known magnetic sensors which utilize an avalanche or ionization process in creating a magnetically variable output voltage.

OBJECTS

In light of the foregoing prior art, it is an object of the present invention to provide an improved class of transistor structures in which a controlled avalanche breakdown or ionization voltage condition can be created and stably maintained.

It is another object of the present invention to provide, in an avalanche breakdown transistor, improved means for creating and controlling impact ionization processes.

A further object of the present invention is to provide an improved magnetically variable controlled avalanche voltage transistor which is responsive to magnetic fields.

Still a further object of the present invention is to provide a improved high sensitivity, low noise magnetic sensor utilizing a variable avalanche voltage transistor structure.

BRIEF DESCRIPTION OF DRAWINGS

The invention described herein will now be detailed with regard to specific preferred embodiments thereof which may be best understood in conjunction with the illustrative examples and descriptions given in the drawings, in which.

DISCLOSURE OF THE INVENTION

Figure 1:
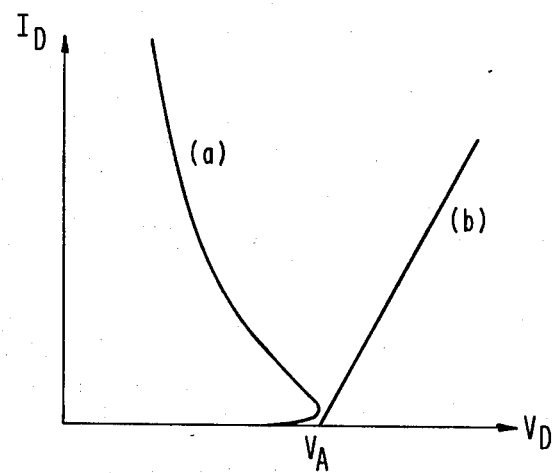
FIG. 1 depicts typical collector voltage and current characteristics of known extremes in the avalanche breakdown mechanisms as illustrated for general avalanche breakdown behavior unlike that of the present invention.

As will become apparent herein, a new class of avalanche breakdown voltage transistor devices having utility, either as voltage limiting transistors or as magnetically responsive transistors is described herein. The discussion will first detail the known characteristics and critical parameters for creating a new and heretofore undiscovered controlled avalanche voltage in a transistor conduction device by means of physical effects not previously described. The theory of operation as it is presently known is also discussed for such a device. Secondly, the discussion describes preferred embodiments of a magnetically responsive avalanche voltage transistor structure employed as a magnetic sensor according to the present invention.

SUMMARY

A novel, transistor having a sudden transition into ionization and conduction which is also a highly sensitive magnetic field sensor has been discovered. Experimental evidence indicates that the operative mechanisms for devices and sensors of the class described herein are unique and heretofore undiscovered. An entirely new effect is believed to be operative in the present sensors which cannot be characterized in terms of prior art Hall or magneto resistive sensor devices. It is shown that the alpha characteristic of hybrid bipolar transistors in combination with the impact ionization multiplication factor can be so tailored as to create a controlled avalanche breakdown voltage having the unique characteristic of being magnetically variable. The theory of operation cannot be accounted for by the so-called Hall effect or by any magneto resistive mechanisms previously known.

BASIC TRANSISTOR CHARACTERISTICS

The basic operative mechanisms and characteristics of the unique alpha effect controlled avalanche voltage transistor of the present invention will be described next. More detailed technical considerations will be further amplified in subsequent sections herein.

The magnetically variable alpha effect controlled avalanche voltage transistor and magnetic sensor device is best embodied as a specific hybrid NPN or PNP lateral bipolar transistor device. Unlike prior art transistor devices, the new device operates in a specially controlled avalanche breakdown mode. As used herein, the term "avalanche breakdown" is a general one for describing the effects of the process called impact ionization. The ionization process of interest occurs in the semiconductive material in the stochastic region formed at the collector and base PN junction. Unlike prior art avalanche mechanisms, however, the new avalanche mechanism may be specifically controlled.

Impact ionization itself may be generally characterized as a phenomenon that occurs when minority carriers within the collector depletion region of a transistor gain sufficient kinetic energy in a sufficiently high field energy density region to disrupt the covalent bonds and create ionization of the atomic crystalline structure of the semiconductive material in the region. This results in the generation of excess electron-hole pairs as well understood in the art.

The desired electron-hole pair generation process for the present invention occurs when the energy density of the electric field at the collector-base PN junction is high enough to permit minority carriers entering the high energy region to create covalent bond disruptions. The result of this process is an avalanche of excess electron-hole pairs generated in a multiplication process. This is not to be confused with the so-called Zener breakdown. The latter process does not depend upon minority carriers for the initiation of the ionization process. It is well to note at this point that the minority carriers may be either electrons or holes, but in the specific embodiments described herein, the minority carriers are electrons. As is well-known in the art, the terms "minority" and "majority" carriers refer to electrons and holes and to the principle mode of conduction as defined for the material type being used. P-type material has holes as the "majority" carriers and electrons as "minority" carriers. The opposite is true for the N-type material.

Turning now to FIG. 1, typical voltage and current characteristics for the collector of a transistor device are illustrated. When transistors are employed, the shield voltage will be assumed to be zero in FIG. 1. In FIG. 1, the collector current $I_D$ is illustrated on the vertical axis and the collector voltage $V_D$ on the horizontal axis. A specific avalanche breakdown voltage $V_A$ at which the device suddenly conducts is depicted. Two types of avalanche breakdown sudden conduction characteristics are known to exist as shown in FIG. 1. The first type, identified by the relationship depicted by the small letter a is that typically exhibited by most conventional transistors and bipolar devices. It illustrates a negative resistance characteristic curve that is generally understood in the art to be that of the avalanche breakdown type. It is generally to be avoided since this negative impedance condition leads to unwanted current overloads, oscillation and other instabilities and non-linearities not generally desired in such devices. The second avalanche breakdown characteristic identified by b in FIG. 1 illustrates a positive resistance characteristic which is not as common in transistors but is characteristic of diodes. This process of linear or positive resistance breakdown is generally encountered as described below.

It should be understood that, without injection of minority carriers into the semiconductor, a positively sloped collector current characteristic, (curve b, FIG. 1) is a natural consequence of conducted holes recombining with minority carriers within the P type region outside of the depletion region in which they are created. In the absence of injected minority carrier electrons, holes will be totally conducted by a base contact. The slope of this positive avalanche impedance region, Curve b, FIG. 1, has been found to depend inversely on the acceptor concentration $N_A$ characteristic of the P type region. In order to inject electrons and avoid base hole conduction, the emitter region must consist of a material type opposite to that of the base. In the preferred embodiment, the base voltage is allowed to float above the emitter potential.

Figure 2:
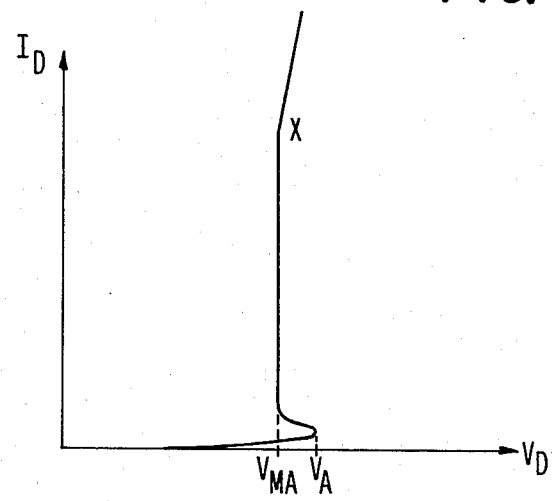
FIG. 2 illustrates collector voltage and current characteristics for a new avalanche breakdown phenomenon created, employed and controlled in the present invention.

The operation of the devices of the present invention depends upon the creation of a critical and controlled suddenly conductive avalanche breakdown voltage condition as illustrated in FIG. 2.

In FIG. 2, the collector current is again illustrated on the vertical axis and the collector voltage on the horizontal axis. A specific and new breakdown voltage $V_{MA}$ having a vertical, or substantially vertical characteristic following an initial slightly negative characteristic is shown. The new and critical breakdown voltage $V_{MA}$ is also the magnetically variable alpha effect controlled avalanche voltage employed in transistors and magnetic sensors according to the invention. It will be noted that this new breakdown voltage exists at a lower voltage than the typical avalanche breakdown voltage $V_A$ depicted in FIG. 1.

The new current and voltage characteristic depicted in FIG. 2 exhibits a very low impedance profile (essentially a zero collector impedance) operative over a substantial portion of the current range and occurring principally at a critical avalanche voltage $V_{MA}$. Under certain circumstances to be described below, the critical voltage $V_{MA}$ can be modulated or varied by means of a magnetic field and $V_{MA}$ may be shifted to the left or to the right in FIG. 2.

The critical breakdown voltage depicted in FIG. 2 can be created and controlled by the proper choices in device element characteristics and geometry and by proper control of the ionization multiplication factor together with a probability factor alpha to be described. These and other factors determining the critical breakdown voltage are as follows:

The preferred, zero impedance avalanche condition is achieved by:

a. Creating a depleted region within the semiconductor material which extends at least part of the distance from the collector to the emitter.

b. Creating an emitter diffusion region within the base material with a material type opposite to that of the base.

c. Controlling the emitter injection efficiency. This correspondingly controls part of the overall magnitude of the electron-hole recombination probability factor $\alpha$. This control technique is discussed and illustrated subsequently and is related to the minority carrier and majority carrier lifetimes or recombination rate which is a transportation efficiency related phenomenon.

d. By controlling the resistivity of the emitter extender or controlled injection region which acts as the minority carrier emitter. The emitter extender region has been found to control the injection efficiency as discussed subsequently. For best performance, the product of collector current and the equivalent resistance of the controlled injection region or emitter extender region should be close to the emitter contact potential $$\psi = (KT/q) \ln(N_A N_{DE}/N_i^2)$$

Where:

$N_A$ is the base acceptor concentration
$N_{DE}$ is the donor concentration of the emitter extender region which is the emitter.
$N_i$ is the intrinsic carrier concentration of the base material.
K is Boltzmans constant
T is Kelvin temperature
q is electron unit charge e. Controlling the distance $L_2$ which separates the emissive junction at the controlled injection region from the depleted zone near the collector regions. It has been demonstrated the electron recombination (transportation efficiency) within this region encompassed by distance $L_2$ is proportional to the length of this region and to the acceptor concentration in it which also may be varied as a means of controlling $P_2$.

f. Choice of base resistivity. The transportation efficiency factor $\alpha_T$ and injection efficiency $\gamma$ are both found to be proportional to substrate resistivity.

Unlike most transistor devices, this device operates in a special avalanche breakdown mode. As noted, avalanche breakdown is a general term which describes the effects of a process called impact ionization. This process is controlled to occur close to the stochastic region formed at the collector-base PN junction. Unlike most avalanche mechanisms, the avalanche mechanism of these devices is a controlled ionization process. In general, as previously stated, impact ionization is a mechanism which occurs when the minority carriers within the collector depletion region gain sufficient kinetic energy to disrupt covalent crystal bonds causing the generation of electron-hole pairs. The desired electron-hole pair generation process occurs if the energy density of the electric field ($\frac{1}{2}$ E·D) at the drain PN junction is high enough to permit minority carriers (electrons) entering the high energy density region to create the covalent bond disruptions. Again, this avalanche process is not to be confused with Zener breakdown. The latter process does not depend on minority carriers to initiate the ionization process. The collector voltage current characteristics which reflect usual avalanche breakdown mechanisms are illustrated by FIG. 1 discussed above.

Most bipolar devices exhibit a negative resistance characteristic curve (a) which is more typical of avalanche breakdowns than the positive resistance characteristic, curve (b). The operation of the new device depends on a critical avalanche condition illustrated in FIG. 2. As was noted above, this new characteristic exhibits essentially a zero collector impedance operative over a substantial current range and it occurs at a critical avalanche voltage $V_{MA}$. This critical voltage is below that voltage usually defined as the avalanche breakdown voltage $V_A$ FIG. 1. The critical voltage $V_{MA}$ can be modulated by means of a magnetic field and will be called the magnetic avalanche voltage.

The critical properties can be controlled by proper choice of device geometry and by controlling M·$\alpha$ as shown in Eq. (1). In Eq. (1), the product of the avalanche current multiplication factor M, and an electron-hole recombination probability factor $\alpha$, Eq. (2) are included.

$$M \cdot \alpha = 1 - (V_{MA}/V_{CB_o})^N \qquad \text{Eq. (1)}$$

Where:
$V_{MA}$ is the magnetic avalanche voltage
$V_{CB_o}$ is the collector-base avalanche breakdown voltage with emitter open, and base contact at ground potential.
N is the avalanche multiplication exponent.

$$\alpha = \gamma \alpha_T \qquad \text{Eq. (2)}$$

Where $\gamma$ is injection efficiency
$\alpha_T$ is a transportation efficiency factor.

The above factors are controlled collectively to achieve a critical value for the product M·$\alpha$ throughout a substantial collector current range. Experimentally, it has been found that the product M·α should preferably be close to 0.5 but less than unity.

To summarize the findings, when the correct M·α product is achieved, the critical avalanche condition, FIG. 2, is obtained. If, however, the product of the probability factor alpha and avalanche multiplication M approaches one and is a nonlinear function of current, then a negative resistance collector current characteristic will occur like that shown by curve a, FIG. 1. If no emitter injection of minority carriers is achieved and a base contact is made to ground, then the positive slope drain characteristic curve b, FIG. 1 is attained.

An additional parameter critical to the performance of these devices is the ionization promotion means. The efficiency or magnetic sensitivity of these devices depends on creating localized impact ionization activity. It is desirable that impact ionization only occur at the collector region subtended by the majority-minority carrier recombination region. Referring to FIG. 7B, the ionization promotion means may consist of a thin oxide window region 6a sandwiched between the accelerator electrode 7 and the surface of the semiconductive material 18. The electric field generated between the accelerator electrode 7, normally grounded, and collector regions 4, adds to the field in the collector depletion region 20. These two field components are sufficient to raise the electric field energy density within the appropriate region to promote localized impact ionization. The desired location for ionization is the region surrounding the tips of the collectors 17 in FIG. 7A and facing the emitter region 1b.

Equation 3 gives an approximate expression for the avalanche threshold breakdown voltage $V_{CB_o}$, where $V_{CB_o}$ is the collector to base breakdown voltage with emitter open.

$$V_{CB_o} = \frac{1}{2} \epsilon_I^2 \left[ \frac{1}{\left(\frac{q}{\epsilon_s}\right) N_A + \frac{\epsilon_I}{25 T_{ox}}} \right] \quad \text{Eq. (3)}$$

Where:

$\epsilon_I$ is the ionizing field strength.
$N_A$ is the acceptor concentration.
$N_D$ is the donor concentration of the collector diffusions.
$T_{ox}$ is the thickness of the oxide layer.
$\epsilon_s$ is the dielectric constant of silicon.

Figure 8:
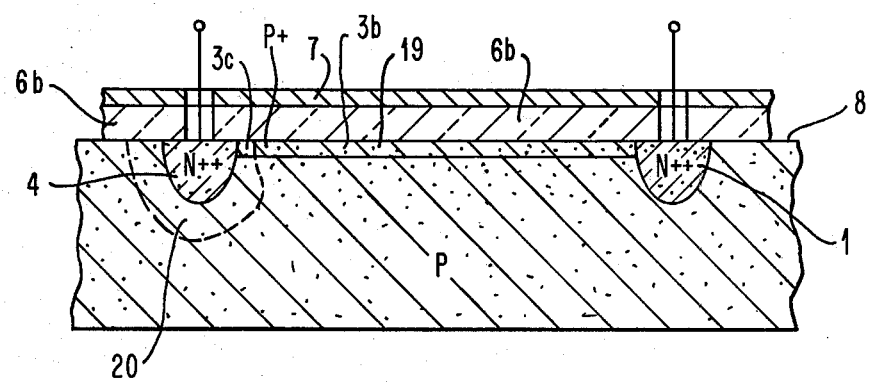
FIG. 8 illustrates in greater detail some of the elements of the new class of transistors described and utilized in the present invention as an alternative embodiment thereof.

Referring to FIG. 8, an alternate means of promoting local ionization is provided by implanting a P+ type Boron layer 19 below the surface of the semiconductive base material 8. The minority carrier acceptor concentration of the P+ layer is to be greater than the acceptor concentration of the surrounding P type semiconductive material. A depletion layer 20 which extends from the collectors toward the emitter is formed at the junction of the promotor layer 19 and collector diffusions, 4. The avalanche breakdown voltage, $V_{CB_o}$, for the device of FIG. 8 is approximated by Eq. (4).

$$V_{CB_o} = \frac{1}{2} \epsilon_I^2 (\epsilon_s/qN_{AI}) \quad \text{Eq. (4)}$$

Where:

$\epsilon_I$ is the critical ionizing field strength for a given implanted acceptor concentration $N_{AI}$.
$N_{AI}$ is the acceptor concentration of the implanted promotor region.

The electrode 7, serves basically as a shield to prevent stray electromagnetic fields from interfering with device performance. The oxide layer 6b is relatively thick, on the order of 4000 Å or greater and has little effect on determining breakdown voltage. In contrast, a relatively thin oxide layer 6a would be approximately 300 Å.

The creation of the foregoing critical avalanche breakdown voltage characteristics, the device geometry and critical parameters and the mode of construction and application will be described in greater detail below. However, it is desired at this time to describe in further detail the unique magnetic effects ascribed to modulations of the critical breakdown voltage by means of magnetic fields for devices embodied as magnetic sensors.

MAGNETIC SENSOR

A unique and heretofore undiscovered magnetic effect is best utilized when a dual collector device is constructed utilizing the alpha effect controlled avalanche voltage transistor of the present invention. Such a device is schematically illustrated in a pseudo-plan view as shown in FIG. 3 where, for clarity, overlying metal and oxide layers are only indicated by lines without respect for hidden lines beneath the layers.

The basic operative characteristics of the magnetically responsive transistor device will first be described in simple terms. More detailed technical considerations will be amplified in subsequent paragraphs.

Figure 3:
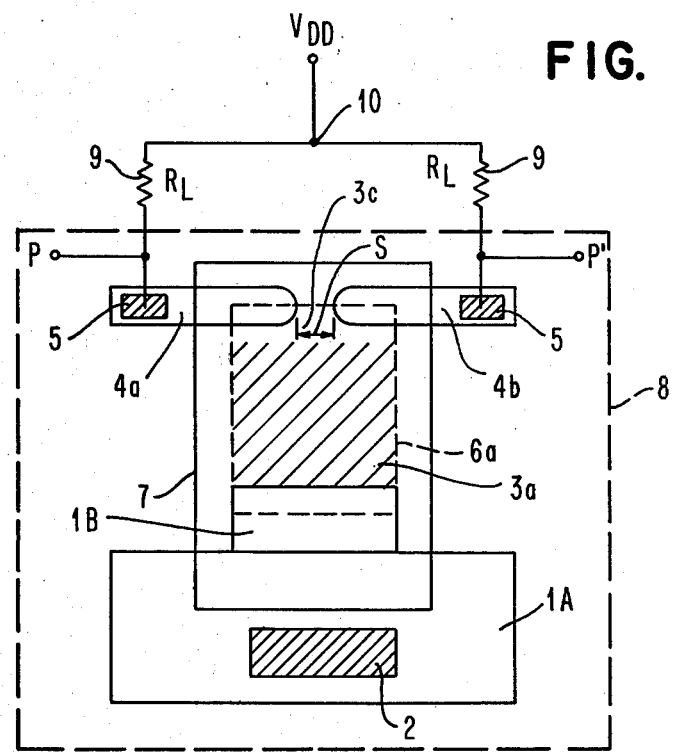
FIG. 3 illustrates in schematic form a pseudo-plan view of a dual collector magnetically responsive transistor employing the avalanche breakdown phenomenon which forms a part of the invention.

In FIG. 3, an emitter of minority carriers for p-type material (electrons) is depicted as 1A. The emitter 1A is supplied with electrons through a metal contact 2 normally connected to electrical ground (not shown). Electrons from the emitter 1A are conducted in a base region 3 toward the collectors 4 which are spaced apart by a small distance S as shown. The collectors 4 are supplied with metal contacts 5 for connection to the output points P and P' in series with load resistances 9 which are commonly connected to a collector voltage supply $V_{DD}$ identified as numeral 10. A substrate of suitable semiconductive material or other support for the semiconductive elements is shown as 8.

Figure 7A:
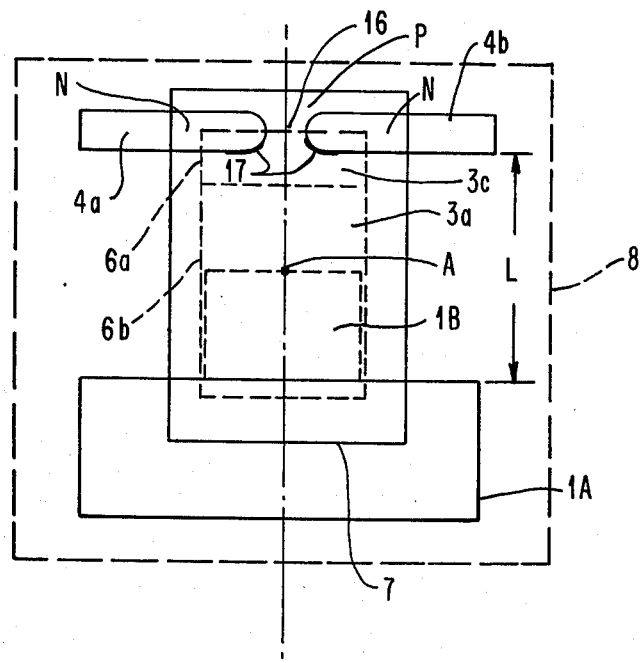
FIGS. 7A and 7B illustrate, respectively, a pseudo-plan view and a longitudinal cross-section in the horizontal plane of a dual collector magnetically responsive transistor structure according to the invention.
Figure 7B:
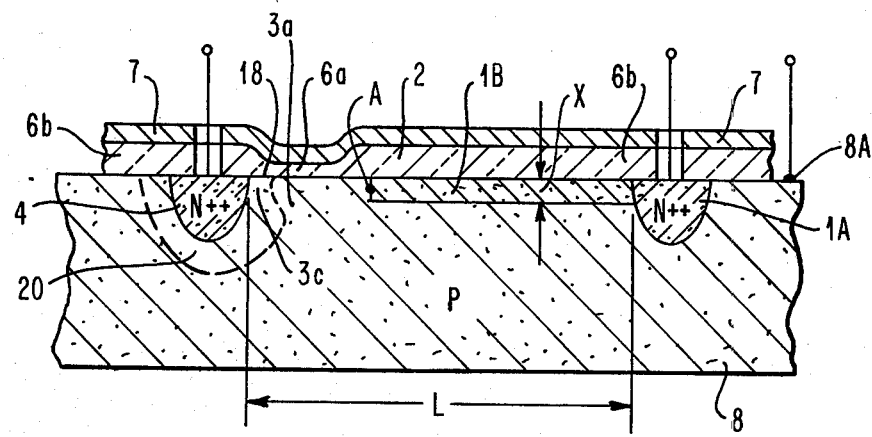

FIGS. 7A and 7B illustrate a top and side view of a typical NPN magnetically sensitive transistor device. The NPN configuration was chosen for illustrative purposes because positive voltage logic devices are more commonly in use. The following discussion also applies to PNP device configurations by appropriate substitution of material types.

A P type semiconductive region 8 is illustrated in which at least two spaced apart collector regions 4 are provided. These regions are heavily doped N++ regions. A heavily doped N++ emitter region 1-A is also shown diffused or implanted within the P region and spaced apart from the collector region by a critical distance L. The emitter region 1-A is positioned such that its midpoint is bisected by a line from the center of the slit region 16 separating collector regions 4.

An emitter extension controlled injection region which acts as an emitter, 1-B is illustrated. This region partially controls recombination of majority carriers (holes) with injected minority carriers (electrons) by controlling the injection efficiency of the emitter 1b. The majority carriers are created by impact ionization. This extension region is shown occupying part of the distance between the emitter and collectors. The emitter extender region 1b contains minority carrier donor ions such as phosphorous implanted to a depth X below the surface of the base material 8. The concentration of the implanted ions is one means to control the injection efficiency and affects recombination mechanism of the minority carriers (electrons) and majority carriers (holes) generated by the process of impact ionization. In effect, the character of the emitter extender region 1b dramatically effects the electronhole recombination probability α which exists between the collectors and emitter. This emitter extender region is a critical α control means for the device and is one means by which the critical avalanche condition, FIG. 2, can be achieved.

As will be appreciated by those of skill in the art, all of the foregoing structure (including the load resistances 9 if so desired) may be embodied on a semiconductive substrate of base material using large scale integration construction techniques for building transistors and other semiconductive devices. The base region is generally indicated by the dashed line 8 in FIG. 3. New elements in the form of a thin oxide region 6a and a metal electrode 7 generally overlying the area 3 and depicted by the dashed line 6a in FIG. 3 are employed to create the structure. The thin oxide region 6a is simply an area of the generally used insulative oxide (in silicon technology) overlying the surface of base material 8 and is utilized for a purpose to be discussed later. An accelerator electrode for the minority carriers is indicated by the overlying region 7. The accelerator may be in the form of a metal conductive element overlying the thin oxide region 6a and overlapping portions of the emitter 1A, 1B, and collectors 4 as shown in FIG. 3.

The new magnetic effect described and utilized in the present invention occurs whenever a magnetic field normal to the plane of the semiconductive substrate surface intersects the device. This creates a change in the controlled avalanche voltage existing within the device when it is operated at the avalanche voltage condition. For example, by applying a north magnetic field into the substrate surface, the avalanche voltage appearing at collector 4b will be lowered and that appearing at 4a will be simultaneously raised by an equal amount. Thus, a differential voltage change between the two output terminals P and P' having a magnitude of twice the voltage change at either collector exists. The polarity of the induced shift in the avalanche voltage will depend on the polarity of the magnetic field applied in the direction normal to the surface of the semiconductor substrate. The area of highest sensitivity is that located in the depleted region in the immediate vicinity of the slit S which separates the two collector regions 4a and 4b.

Figure 4A:
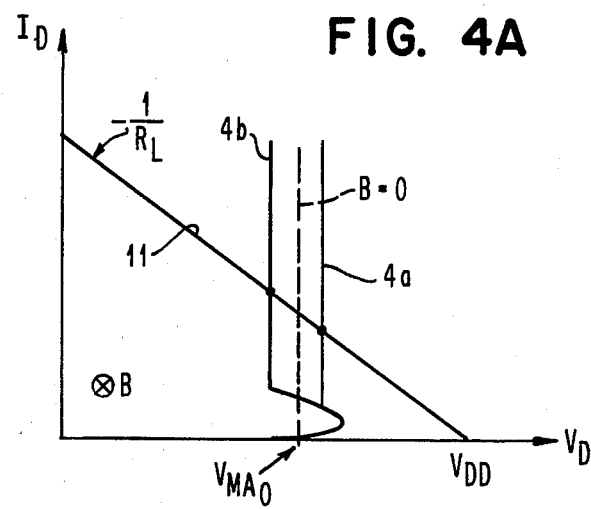
FIGS. 4A and 4B illustrate, respectively, the effects of a magnetic flux field intersecting the device of FIG. 3 in a direction perpendicular to the plane of the device. The effects are described with relationship to the collector voltage and current characteristics of the avalanche breakdown mode depicted in FIG. 2.
Figure 4B:
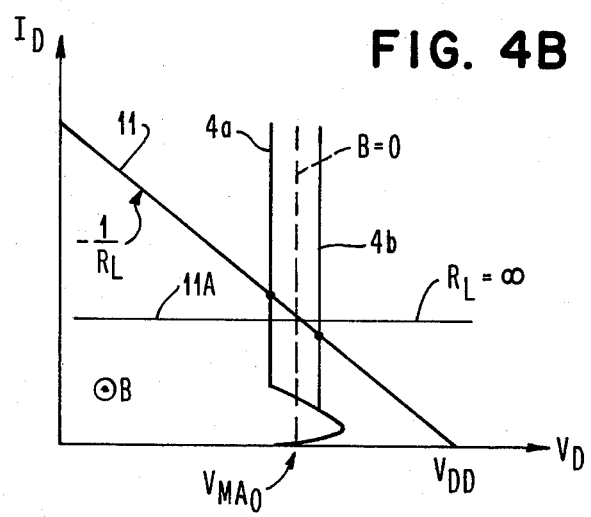

The effects of this magnetically modulated alpha controlled avalanche voltage are illustrated in FIGS. 4A and 4B. The magnetic sensor shown in FIG. 3 will be operated with two separate collector load resistors 9 as shown in FIG. 3. A positive voltage will be applied to the collector voltage terminal 10 and the emitter 1A will be normally connected via contact 2 to ground potential. When a sufficient voltage differential between the emitter and the collectors has been attained, the controlled avalanche voltage $V_{MA}$ can be modulated by a magnetic flux field intersecting the semiconductor substrate.

In FIGS. 4A and 4B, the effects of the load resistances 9 are superimposed as load lines on the collector current and voltage charts in a manner well known in the art. These are the load lines 11. As shown in FIG. 4A, when a magnetic north field (into the plane of the paper) intersects the device, the voltage at collector 4A, shifts upward (to the right in FIG. 4A) and that at collector 4B shifts downward (to the left) from the point at which the initial controlled avalanche voltage $V_{MA}$ existed when there was no magnetic flux field present. The initial breakdown voltage $V_{MAo}$ is depicted in FIGS. 4A and 4B by the vertical dashed line with the indication B=0 directed to it to indicate the zero flux field condition.

The magnetic response signal may be measured as the differential voltage obtained between the terminals P and P' in FIG. 3. The situation is illustrated by the given load line 11 in either FIG. 4A or 4B where the displacement from the original avalanche voltage $V_{MAo}$ (as shown by the output voltages on collector 4a or 4b) is differentially measured. This device can be made quite sensitive to magnetic fields. A sensitivity of more than ten millivolts per gauss has already been achieved in laboratory experiments. This amounts to a sensitivity that is conservatively estimated to be at least 500 times that of the best known Hall cell. The present theory predicts that much higher sensitivities will be achieved. Unlike other magnetic sensors, the present device is very small, i.e., less than $1 \times 10^{-6}$ square centimeters in area. A very high signal to noise ratio for a given bandwidth is also the result of this technology. A signal to noise ratio of greater than three per Gauss megahertz is typical of a device of this type. The units chosen for signal to noise use a base bandwidth of one megahertz for purposes of standardization.

Figure 5:
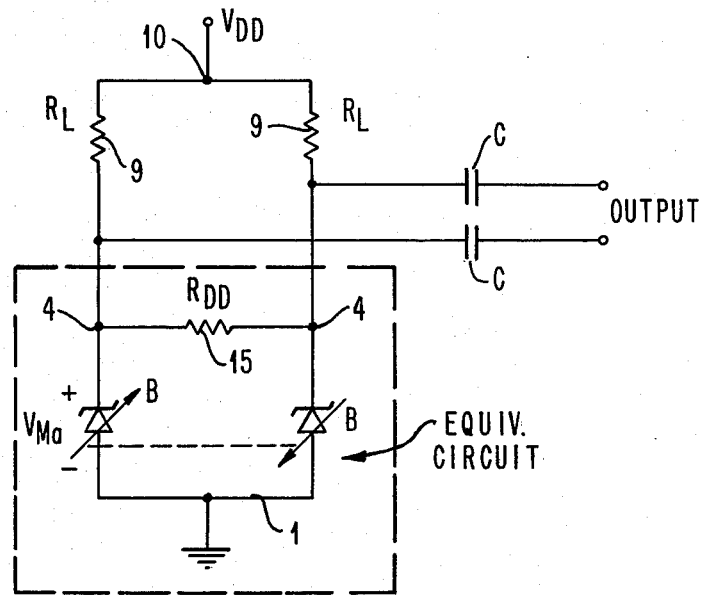
FIG. 5 illustrates in a schematic sense the theoretical model which describes the operation of the device shown in FIG. 3 together with the method of obtaining an electrical signal output.

Many magnetic sensor applications do not require the capability of sensing steady or unvarying flux field components. Although the magnetically responsive transistor herein is perfectly capable of sensing either polarity of steady state flux field components, the usual applications for magnetic sensors require only an A/C or alternating flux field level sensor. Applications for such sensors include scanners for magnetic stripes, tapes, disks, etc., and other coded indicia of the magnetic type. In such circumstances, the drain output terminals P and P' shown in FIG. 3 may be capacitively coupled to demodulation circuitry and logic. Such an A/C coupled configuration is illustrated in FIG. 5.

In FIGS. 4A and 4B, it will be noted that the output voltage and current for collectors 4a and 4b are displaced in opposite directions in response to a given magnetic flux direction. In FIG. 4A, with the flux field passing into the plane of the paper, the output at collector 4a is at a higher voltage than the original avalanche breakdown voltage $V_{MAo}$ and that at terminal 4b is at a reduced voltage. The reverse situation is true in FIG. 4B. In FIG. 4B, with a flux field of opposite polarity to that shown in FIG. 4A, the opposite effect is achieved, but in a symmetrical sense in that the displacements from the original avalanche voltage are equal but of opposite polarity to that shown in FIG. 4A.

Many applications may require sensing steady state magnetic field components. The present device has such a broad band frequency response (extending from zero hertz well into the megahertz region) that it is uniquely advantageous for many different applications. The upper frequency limits for the device are not yet determined. However, the coupling of a differential DC signal component to the output terminals requires the solution of two problems. First, it may be necessary to DC balance the voltage between the output terminals P and P' to obtain symmetry about a zero output level. Secondly, a level shift in the voltage of the DC output to be compatible with conventional bipolar circuit voltage levels, i.e., typically five to twelve volts, may be required. The second requirement stated is a direct result of the relatively high DC voltages (typically on the order of 25 volts) that are utilized to create the impact ionization condition for the controlled avalanche voltage generation. This relatively high voltage appears at the output terminals P and P' in FIG. 3.

Figure 6:
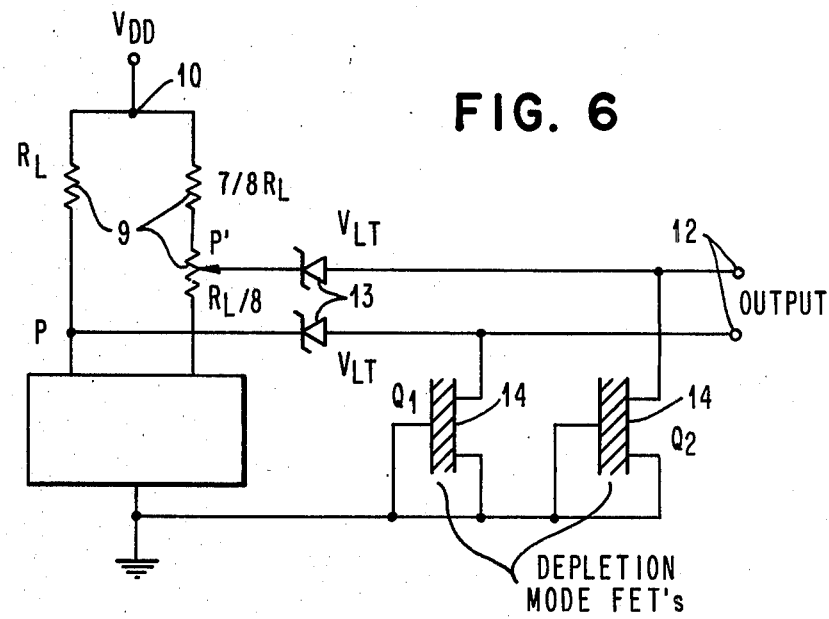
FIG. 6 illustrates in a schematic diagram the preferred mode of employing devices of the present invention in an electrical circuit operated at voltages suitable for integration on large scale integrated semiconductor chips or at levels compatible therewith.

FIG. 6 illustrates one method of combining the DC level shifting operation with output balancing. The DC level shift is accomplished by use of voltage limiting transistors which are, in fact, alpha effect controlled avalanche voltage transistors of the present invention utilized in a slightly different manner. These devices are, of course, described fully herein, but their use will be briefly described at this point.

The voltage limiting transistor devices are coupled between the magnetic sensor collector terminals P and P' and the output terminals 12 illustrated in FIG. 6. The voltage limiting transistors are identified as transistors 13 and, while a Zener diode type of symbol is employed for illustrative purposes, it will be understood that these are not Zener diodes (although these could be used) but are the specific alpha effect controlled avalanche voltage transistors described herein. Two depletion mode FET devices $Q_1$ and $Q_2$ identified by numerals 14 in FIG. 6 are utilized to sustain a small reverse bias current required for proper operation of the voltage limiting transistors 13. The manual balancing arrangement comprising a potentiometer having a resistance of approximately $\frac{1}{8}R_L$ is a portion of the output load resistance 9 in one leg of the output circuit as shown.

A more conventional manual balancing scheme such as a potentiometer located directly between the output terminals will not work with the present invention due to the very low internal collector to collector ionization impedance $R_{DD}$. This is shown in FIG. 5 where a schematic model of a capacitively coupled output from the magnetic sensor of the type described in the present invention is shown. The low internal impedance $R_{DD}$ between the collectors 4 is of great utility as will be discussed in greater detail subsequently.

The circuit arrangement illustrated in FIG. 6 can be easily embodied using integrated circuit manufacturing concepts and techniques or in particular by the use of the so-called silicon on sapphire technology. This latter type of technology is particularly attractive since the individual semiconductive regions can be easily and totally isolated from one another in the electrical sense by locating them on isolated portions of the non-conductive sapphire substrate. This, of course, is well known in the art and further detail as to this aspect will be dispensed with at this point.

Returning to FIG. 5, the schematic model of the operative sensor according to the present invention is generally described by a pair of variable avalanche voltage diodes in parallel and operating oppositely to one another in response to the intersection of a magnetic flux vector B.

BASIC ALPHA EFFECT CONTROLLED AVALANCHE VOLTAGE TRANSISTOR REQUIREMENTS

The fundamental parameters and requirements necessary for the construction and operation of the alpha effect controlled avalanche voltage transistors of the present invention are summarized as follows:

(1) At least one collector area formed within a semiconductive region of material and consisting of a material of a type opposite to that of the base area in or on which it is formed.

(2) At least a emitter area is formed within or on the same semiconductive substrate and is spaced apart from the collector by a uniform and critical length L. The emitter material is of the same type as the collector and is opposite to that of the semiconductive base in or on which it is formed.

(3) An injection efficiency control means in a region touching the emitter and extending at least part of the distance toward the collector and acting as an emitter of minority carriers. The injection efficiency control part of the emitter may consist of a controlled donor concentration region which extends into the region between the collectors and emitter contact. The electrical conductivity of the injection efficiency control region is effective in controlling the injection efficiency $\gamma$.

(4) An impact ionization promoter means is provided and must extend at least part of the distance L between the collector and the emitter source.

(5) A transportation efficiency control means for controlling the rate of delivery of minority carriers to the vicinity of the collector area where ionization occurs.

(6) An intrinsic or high resistivity conductive region in which ionization occurs and which can be or is actually depleted is formed within the semiconductor in a region extending at least part of the distance between the collector and the emitter. This particular region occupies an area of finite depth below the surface of the semiconductive base in the region separating the collector and the emitter. This region conducts and allows the combination of majority carriers created by impact ionization with injected minority carriers. This region may be either contiguous with or below the ionization promotion means.

MAGNETICALLY RESPONSIVE TRANSISTOR REQUIREMENTS

The basic parameters and critical requirements of a magnetically responsive transistor device employing the alpha effect controlled avalanche voltage are the same as for the basic transistor structure and include further preferred structural elements which are as follows:

(1) There are at least two of the collectors of the type described with relationship to the alpha effect controlled avalanche voltage transistor.

(2) These collector areas are spaced apart from one another by a distance S defined herein as a "slit width" S.

(3) The impact ionization promotion means which extends at least part of the distance between the collectors and the emitter occupies a space at the collectors which is symmetrically located with respect to the center of the slit S which separates the individual collector areas.

For either the alpha effect controlled avalanche voltage transistor or the magnetic sensor which employs generally the same elements but uses at least two collectors, etc., as detailed above, a source of potential must be applied between the emitter and the collector or collectors. The emitter to collector voltage must be sufficient for initiation of the critical avalanche condition. The emitter may be directly connected to one terminal of the potential supplying means and the collectors to the other terminal thereof through current limiting resistors.

For operation as a magnetic sensor, a magnetic field is applied in the direction normal to the surface of the semiconductive substrate region and is generally of maximum effect in the particular vicinity of the slit S between the collector regions. The differential magnetic voltage response signal may be measured between the output terminals connected to the collector contacts 5 as illustrated in FIG. 3. The circuitry of FIG. 5 or of FIG. 6 has been found particularly advantageous for this purpose.

DETAILED THEORY

The foregoing basic elements for the alpha effect controlled avalanche voltage transistor and for the magnetically responsive device utilizing such transistors will now be described in greater particularity with respect to the theory of operation as it is presently understood and with respect to the specific preferred embodiments and methods of construction employed.

As discussed briefly earlier, FIGS. 7A and 7B illustrate a plan view and horizontal cross sectional view, respectively, of a typical NPN device of the type employed herein. The NPN configuration was chosen for illustrative purposes only and since positive voltage logic devices are more commonly in use, the output from the NPN device is directly applicable. The discussion, of course, applies equally to PNP device configurations as will be understood by those of skill in the art. As used herein, PNP, NPN, etc., refer to the majority carrier material type designations normally employed in the art.

The basic elements of the magnetically responsive transistor according to the present invention are illustrated in FIGS. 7A and 7B. A P type semiconductive region 8 is illustrated in FIG. 7B into which at least two spaced apart collector regions 4 are implanted or diffused. These regions are relatively heavily doped N++ material. A heavily doped N++ emitter region 1A is also shown as diffused or implanted within the P type region 8 and spaced apart from the collector regions 4 by a critical distance length L. The emitter 1a and its extension region 1b is positioned in a manner such that the mid-point of the emitter 1a is bisected by the center line of the slit region 16 separating the collector regions 4. This is shown to greater advantage in FIG. 7A, where a center line is drawn.

The conductive base 3 illustrated in the FIGS. 7A and 7B is composed of several parts 3a, 3c. Section 3a partially controls the recombination of majority carriers (holes) with injected minority carrier electrons from the emitter 1-a. The majority carriers are created in 3c and the majority of recombination occurs in sections 3a. They are created by the impact ionization process which creates electron-hole pairs as is well known. The base region 3 together with the emitter extension region 1b is shown to occupy the entire distance between the emitter 1a and the collectors 4. The emitter extension region 1-b consists of a minority carrier ion donor material such as phosphorous implanted to a depth X below the surface of the substrate 8. The concentration of the implanted ions provides a direct control means for the efficiency of injection and of the recombination mechanism, to a lesser degree, occurring between majority carriers generated by impact ionization process, and the minority carriers injected by the emitter 1b. In effect, the injection efficiency control characteristic of the minority carrier emitter extension region 1b dramatically affects the probability factor alpha. This is related to the recombination rate characteristic that exists between the collectors and the emitter. The implanted minority carrier emitter extension region lies below the substrate surface and extends part of the distance between the emitter and the collector. Majority carrier holes can recombine with emitter injected minority carrier electrodes within region 1b, but primarily occurs in region 3a.

Emitter extender 1-b thus provides both an injection efficiency and a recombination rate control function and is an essential ingredient of the device since it is one means by which the critical sustained avalanche conditions of FIG. 2 are achieved.

When the critical conditions previously given above are simultaneously satisfied, the critical avalanche condition depicted in FIG. 2 is achieved. If the product of the probability factor alpha and the avalanche multiplication factor M approaches 1 and is a non-linear function of current, then a negative resistance collector characteristic will occur as depicted by curve a in FIG. 1.

A second critical parameter for this device is the so-called ionization promotion means.

Referring to FIG. 7B, the ionization promotion means in the example shown consists of a thin oxide region 6a sandwiched between an accelerator electrode 7 and the surface 18 of the semiconductive material 8. The electric field generated between the accelerator electrode 7 (normally grounded) and the collector regions 4 adds to the field already existing in the collector depletion region 20. This already existing field will be described later below. As has previously been explained, the two field components are of sufficient magnitude, when combined, to raise the electric field energy density within the region in the vicinity of the collectors high enough to cause localized impact ionization to occur.

COLLECTOR GEOMETRY CONSIDERATIONS

The operation of the magnetically variable alpha effect controlled avalanche voltage transistor and magnetically responsive sensor embodiments depicted in the Figures depend upon the dual collector configuration for operation as magnetic sensors such as shown in FIG. 7A for example. The width of the slit area 16 between the collector tips 17 of collectors 4 is a critical factor in determining the optimum device performance. The slit 16 separates the two N++ type collector diffusions 4 and consists of a P type base material. As is evident from FIG. 7A, a NPN structure exists between the collectors 4a and 4b.

The reverse bias potential (i.e., positive voltage on the N type collector) simultaneously applied to the collectors 4A and 4B will enhance the extent of the depletion region 20 formed in the vicinity of the collector tips 17 and surrounding the collectors 4. As the depletion boundaries grow outward in response to increasing collector potential, the P type region in the slit 16 will become completely depleted. It is important for proper operation of magnetically responsive devices as constructed according to the present invention that a so-called "over depletion" condition exist within the slit area 16. Also, it is important that this condition occur at a collector potential which is less than that at which the controlled avalanche voltage occurs. That is, the area between the collector tips must become totally depleted and, in fact, over depleted prior to the time the controlled avalanche voltage is reached for the transistors structure defined between the primary emitter 1A and the collectors 4.

FIGS. 9A through 9F illustrate the formation of the depletion boundaries in the vicinity of the two adjacent N++ collector diffusions which are separated from one another by a P type material having a slit width S as shown. As shown by the series of illustrations, the depletion regions having width $l_p$ expand or grow laterally in response to the increasing voltage simultaneously applied to both collectors 4. The depletion region of concern is that lying within the P type material in the slit region S.

Figure 9A:
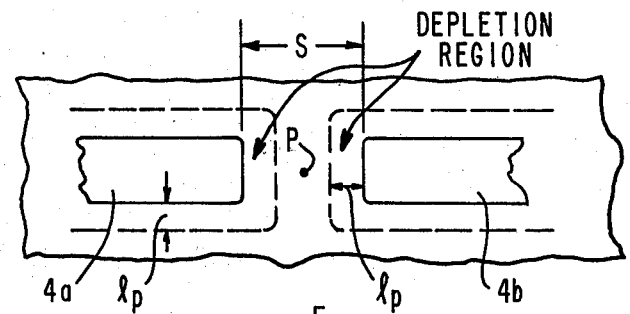
FIGS. 9A through 9F schematically illustrate the effects in the region in the immediate vicinity of a dual collector portion of the magnetically responsive transistor. The effects are described with relationship to the present invention as the voltage on the collectors is increased to deplete the area between the collectors.

FIG. 9A illustrates the depletion boundary formed within the P type material surrounding each collector region as a natural consequence of the material dissimilarity between the materials in the collector tips and the substrate. As shown in the electrical field strength diagram 9B, positioned immediately beneath FIG. 9A and centered with respect to the center of slit S, an electric field is created within the depletion region which is a function of the distance between the stochastic PN junction and a point within the depletion zone $l_p$. As illustrated, the depletion boundaries have no tendency to overlap.

Figure 9B:
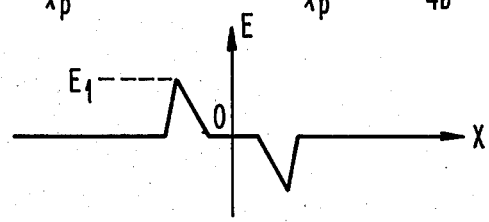
Figure 9C:
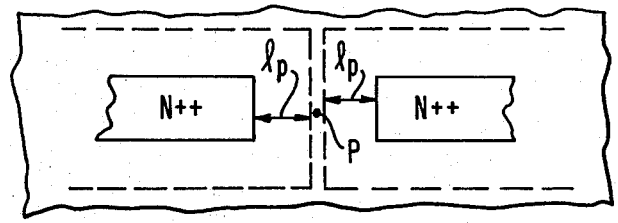

FIG. 9C illustrates the growth of the depletion boundaries in response to an increase in reverse bias potential applied to the collector diffusions 4A and 4B. The critical situation is illustrated where the depletion boundaries have been extended to almost touch one another in FIG. 9C.

FIGS. 9A and 9C illustrate depletion conditions which correspond to electrical isolation between the two N++ collector diffusion regions. Essentially no electrical current can be conducted between the two diffusions given a small differential voltage applied between the collectors when the depletion region exists as illustrated in FIGS. 9A or 9C.

Figure 9D:
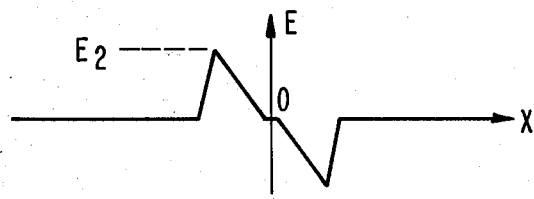
Figure 9E:
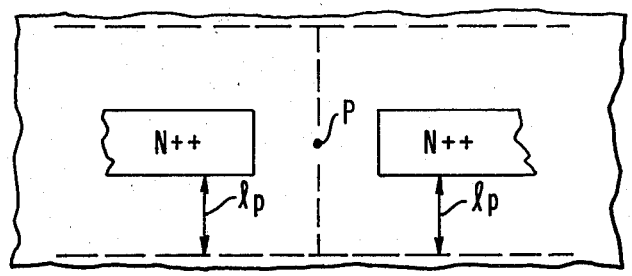

However, FIG. 9E illustrates an entirely different circumstance. In FIG. 9E, the depletion boundaries illustrated correspond to a condition where there is an apparent overlap or touching of depletion zones within the region midway between the two collector diffusions. For this condition, the electric field $E_O'$ experienced at the stochastic junction of each N++ diffusion facing one another and produced by an intervening space charge is inadequate to terminate any thermally agitated electrons from attempting to traverse the depletion region separating the collector diffusions. In short, in this condition, electrical conduction can occur between the collector diffusions 4. However, a differential voltage must occur to sustain such conduction.

Figure 9F:
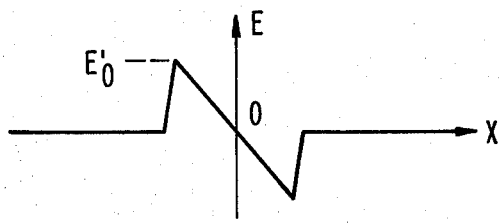

Point P shown in the exact center in FIGS. 9A through 9F lies exactly midway between the collectors 4. For the depletion boundary circumstances corresponding to FIGS. 9A and 9C, the potential at point P as illustrated in FIGS. 9B and 9D is essentially the same potential as that of the emitter (not shown). (That is, ground.) Stated differently, substantially all of the collector potential is developed across the depletion region separating the collector tips from one another and the depletion region separating the collectors from the emitter. However, the potential at point P for the condition corresponding to that depicted in FIG. 9E and FIG. 9F is not zero.

Equations (5) and (6) below give expressions which are generally accepted in the art for describing the width of depletion layer $l_p$ within the P type region and the peak electric field $E_O$ which occurs at an abrupt stochastic PN junction.

$$l_p = \sqrt{\frac{2\epsilon_s}{q}(\psi - V)\frac{N_D}{N_A(N_D + N_A)}} \qquad \text{Eq. (5)}$$

$$|E_O| = \sqrt{\frac{2q}{\epsilon_s}(\psi - V)\frac{N_A \cdot N_D}{N_A + N_D}} \qquad \text{Eq. (6)}$$

The electric field in the vicinity of the two collectors corresponding to the depletion conditions depicted in FIGS. 9A, 9C and 9E are depicted in FIGS. 9B, 9D, and 9F, respectively. The depletion lengths $l_p$ tend to overlap as depicted in FIG. 9E, where $l_p$ in front of the collectors exceeds one-half the slit width S so that the electric field within the slit region becomes limited while that in front of the collectors does not. The midpoint voltage level $V_{mp}$ for point P within the slit region S is given by Equation (7) below.

$$V_{mp} = V_D - \tfrac{1}{2}E_O'S \qquad \text{Eq. (7)}$$

The limiting value $E_O'$ is determined by the usage of Equation (5) and Equation (6).

Setting $l_d$ in Equation (5) equal to S/2 gives the following.

$$\left(\frac{S}{2}\right)^2 = \frac{2\epsilon_s}{q}(V_D - V_{mp})\frac{N_D}{N_A(N_D + N_A)} \qquad \text{Eq. (8)}$$

and the electric field $E_O'$ is obtained from Eq. (6) as $$E_O' = \sqrt{\frac{2q}{\epsilon_s}(V_D - V_{mp})\frac{N_A \cdot N_D}{N_A + N_D}} \qquad \text{Eq. (9)}$$

Solving Eq. (8) for $(V_D - V_{mp})$ gives:

$$(V_D - V_{mp}) = \left(\frac{S}{2}\right)\frac{q}{2\epsilon_s}\left(\frac{N_A(N_D + N_A)}{N_D}\right) \qquad \text{Eq. (10)}$$

Substituting Eq. (10) into Eq. (9) for the term $(V_D - V_{mp})$ yields:

$$E_O' = (q/2\epsilon_s)SN_A \qquad \text{Eq. (11)}$$

Substituting Eq. (11) into Eq. (7) gives the desired expression for the midpoint voltage:

$$V_{mp} = V_D - \tfrac{1}{8}S^2(q/\epsilon_s)N_A \qquad \text{Eq. (12)}$$

The maximum acceptor concentration $N_A$ which will just permit the critical depletion overlap can be found by setting the midpoint voltage $V_{mp}$ of Eq. (12) equal to zero. Thus, the equivalent acceptor concentration or the maximum acceptor concentration that may be used in the device in the area between the collectors for a given collector voltage $V_D$ and a given slit width S is given by Equation (13).

$$N_{eq} = 8V_D\epsilon_s/qS^2 \qquad \text{Eq. (13)}$$

The acceptor concentration $N_{eq}$ corresponds to the critical depletion width condition and will be used subsequently to determine the hole concentration that may flow in the slit region when impact ionization occurs. The critical acceptor concentration provides the basis for calculating the collector to collector ionization impedance $R_{dd}$.

Equation (12) gives the desired expression for the midpoint voltage $V_{mp}$ when the depletion zone overlap condition occurs. Equation (12) is applicable whenever the collector voltage $V_D$ is greater than $$N_A q S^2 / 8 \epsilon_s$$

Otherwise, the midpoint voltage $V_{mp}$ is essentially zero. As is obvious from equation (12), the midpoint voltage approaches the collector voltage given substrate materials with a low enough acceptor concentration $N_A$ (high resistivity materials at a narrow spacing S between collectors). A non-zero midpoint voltage is essential to the sensitivity and operation of the magnetic sensor device.

Figure 10:
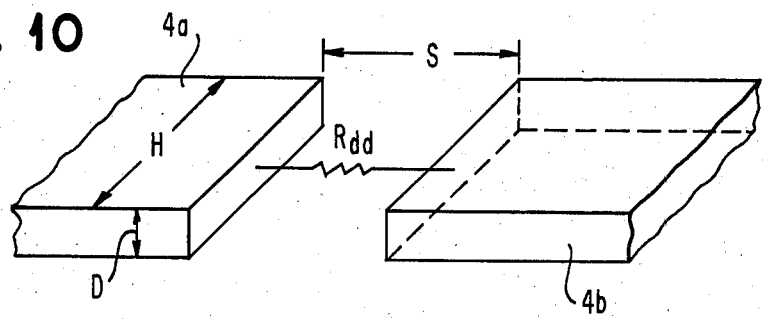
FIG. 10 illustrates in a simplified schematic form, how the collector to collector ionization impedance is determined for a device as depicted in FIG. 7A.

The collector to collector ionization impedance $R_{dd}$ is determined for the device in FIG. 7A as follows:

With reference to FIG. 10, two collectors 4A and 4B respectively are separated by distance S, the collectors having a height D and a width H as shown.

From first principles of physics, the collector to collector resistance $R_{dd}$ is given by Equation (14).

$$R_{dd} = S/\sigma HD \qquad \text{Eq. (14)}$$

Where:

$$\sigma = N_H q \mu \qquad \text{Eq. (15)}$$

and $$N_H = (N_{eq} - N_A) \qquad \text{Eq. (16)}$$

Substituting Eq. (15) and (16) into Eq. (14) yields:

$$R_{dd} \approx \frac{S}{(N_{eq} - N_A) \mu q \, HD} \qquad \text{Eq. (17)}$$

Where:
 $N_{eq}$ is given by Equation (13)
 $N_A$ is the substrate acceptor concentration
 H is the collector height dimension
 D is the collector depth dimension
 S is the slit width between the drains
 $\mu$ is the mobility of majority carriers and
 q is electron unit charge.

By use of Eq. (17), the differential driving source impedance of the magnetic sensor device is quite low as the computations will reveal. The low collector to collector impedance accounts for the large signal to noise ratio and nearly balanced DC output characteristic of devices of this type. A low driving source impedance is also useful for minimizing stray capacitive effects which otherwise may limit the high frequency capabilities of the sensor.

TYPICAL MAGNETICALLY VARIABLE DEVICE PERFORMANCE CHARACTERISTICS

Figure 11:
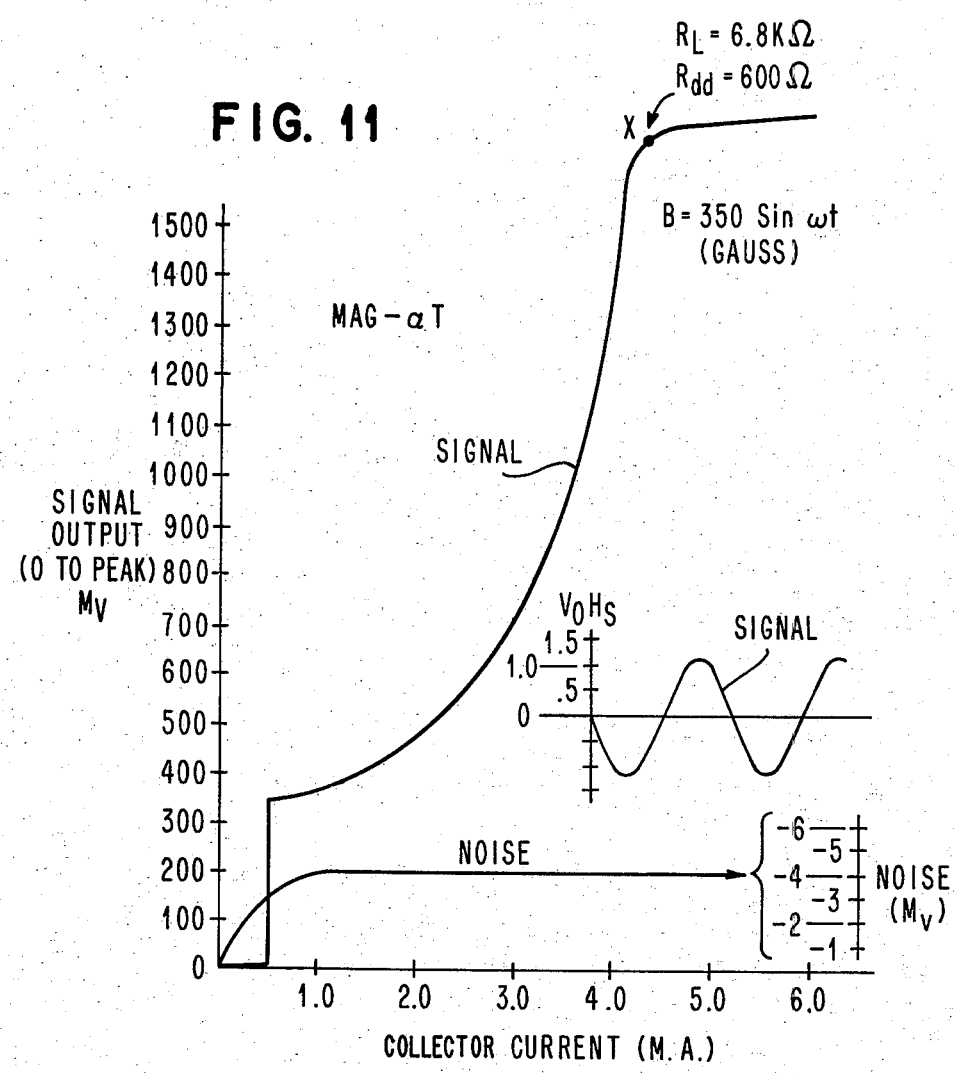
FIG. 11 illustrates typical collector voltage and current characteristic for a dual collector magnetically responsive transistor device employed as an embodiment of the present invention and also shows the so-called noise component appearing at the outputs thereof.

Many magnetically responsive transistor devices of the type contemplated here have been fabricated and tested. Considerable experimental data has been obtained and some of the data has outstanding features worthy of discussion. FIG. 11 illustrates the behavior of the differential, i.e., collector to collector differential signal, and noise output measured from a sensor constructed using P type two ohm centimeter silicon substrate (base) material. The left hand ordinate is labeled differential output signal from zero to peak measured at 60 hertz using a sinusoidal magnetic field source which delivers a 350 Gauss peak field. The abcissa plots collector current in milliamperes. The right hand ordinate shows peak noise output in millivolts corresponding to the same collector current values for the signal output expressed on the left hand ordinate. The noise bandwidth was limited to one megahertz.

The typical signal response increases abruptly at approximately 500 microamperes of collector current and then increases rapidly with increasing collector current until a saturation point X in FIG. 11 is encountered. Saturation point X corresponds to the collector current break point X shown in FIG. 2. Signal saturation occurs for a given energizing field whenever the injection efficiency of the emitter extender region no longer tracks collector current. This may correspond to a condition where recombination of holes and electrons beings to occur in the undepleted P type region surrounding the depletion region. Majority carriers which recombine outside the depletion region do not contribute to the magnetic response signal but only to the collector current. It may be desirable to operate such a magnetic sensor at a collector current level just above the recombination (depletion layer) saturation level in order to eliminate changes in device sensitivity due to changes in the collector supply voltage $D_{DD}$.

It is significant to note that the noise level is essentially constant throughout the useful operative range of the device. The major source of noise has been found to be that produced by statistical source injection of minority carriers and by surface recombination thereof. One means by which the latter can be minimized is by creating a minority carrier region about 500 Angstrom units below the surface of the substrate. A reduction in noise by a factor of two or more has been achieved in this way in practice.

The constant amplitude characteristic of the noise is attributed to the collector to collector ionization impedance $R_{dd}$ shown in Equation (17). This diminishes as the current is increased, thus alleviating or abating the noise signal exactly in proportion to its generation. As shown by FIG. 11, the typical magnetic sensor output utilized for the specific figure given was constructed and operated as given by the following table. The construction technique is a standard large scale integration photolithography and etch process with ion implantation and diffusion for creating the various conductive areas within the substrate, all of which are processes well known to those of skill in the art.

| | |
|---|---|
| Oxide Thickness under Promoter | = 0.1 micron |
| Slit Width S | = 1.2 microns |
| Collector Height H | = 2.5 microns |
| Collector Depth D | = 0.8 microns |
| Base Substrate Material | = 2 Ω cm P type silicon |
| Length L Emitter to Collector | = 25 microns |
| Width $W_c$ | = 12.5 microns |
| Avalanche Voltage | = 28 volts |
| Accelerator Electrode Voltage | = ground potential |
| Load resistors | = 6.8 K ohm |
| $R_{dd}$ (measured at point X, FIG. 11) | = 700 Ω |
| Donor concentration of collectors & emitter | = $10^{20}$ cm$^{-3}$ |
| Emitter extender resistance | = 150 Ω |

It has been determined experimentally that the sensitivity of the magnetic sensor device depends primarily upon the base acceptor concentration which greatly affects the length of the depletion region in front of the collectors. The sensitivity of these devices has been measured from fabricated examples using substrate resistivities within the range of 0.1 to 50 ohm centimeters. An experimental relationship has been found which reflects sensitivity as shown by Eq. (18).

$$\text{Sensitivity } S = K(N_H/N_A)^{3/2} \qquad \text{Eq. (18)}$$

as expressed in millivolts per Gauss-megahertz.
Where:
$N_H = (N_{eq} - N_A)$
$N_{eq} = $ Eq. (13)
$K = 0.04$

THEORETICAL OPERATIVE MECHANISM

The magnetically variable alpha effect controlled avalanche voltage transistor or magnetically responsive transistor combination can be theoretically analyzed according to a hypothetical operative mechanism. With some effort, it may be shown that the collector current $I_C$ flowing in a common emitter bipolar transistor device configuration operating within the avalanche breakdown region is defined as shown by Equation (20).

$$I_C = \frac{M}{1 - \alpha M}[\alpha I_B + I_{C0}] \qquad \text{Eq. (20)}$$

Equation (20) can be simplified for the special configuration of the magnetic sensor which allows the base (substrate contact) to be unconnected, i.e., to float with $I_B = 0$. This configuration is essentially a three terminal device having two collectors and a single emitter. The simplification yields the following:

$$I_C = \frac{M I_{C0}}{1 - \alpha M} \qquad \text{Eq. (21)}$$

The simplest approximate equation proposed to describe the avalanche voltage is given by Equation (22).

$$V_{MA} = V_{CB0}(1 - \alpha M)^{1/N}(1 - 1/M)^{1/N} \qquad \text{Eq. (22)}$$

Where:
M is the avalanche multiplication factor.
$V_{CB_0}$ is given by Eq. (3) and Eq. (4).
N is the avalanche exponent and has a typical numerical value of 3.0.
$\alpha = \gamma \alpha_T$ recombination probability factor.
$\gamma = $ injection efficiency factor.
$\alpha_T = $ transportation efficiency factor.

Equation (22) can be simplified to describe the device behavior in the region of interest where $M >> 1$ and $\alpha << 1$.

$$V_{MA} = V_{CB_0}(1 - \alpha M^{1/N}) \qquad \text{Eq. (23)}$$

The rate of change of the MAV with a magnetic field B, applied normal to the active channel region, is given by Eq. (24). Equation 24 is derived from Eq. (23).

$$\frac{d(V_{MA})}{dB} = -\frac{V_{MA}}{N(1 - M\alpha)}[M_o \frac{\delta \alpha}{\delta B} + \alpha_o \frac{\delta M}{\delta B}] \qquad \text{Eq. (24)}$$

Where:
$M_o$ is the value of M with zero magnetic field.
$\alpha_o$ is the value of $\alpha$ with zero magnetic field.

It is possible to obtain a full magnetic signal output voltage without modulating drain current. This feature of the devices can be appreciated by examining the effects of the horizontal load line 11a (infinite load resistance) shown in FIG. 4B.

Differentiating drain current Eq. (21) with respect to magnetic field B, one obtains:

$$\frac{dI_c}{dB} = \frac{\frac{dM}{dB} + M^2 \frac{d\alpha}{dB}}{(1 - \alpha M)^2}(I_{C0}) \qquad \text{Eq. (25)}$$

For the horizontal load line situation FIG. 4B, $dI_c/dB = 0$.

Setting Eq. (25) to zero, one obtains an interesting expression.

$$dM/dB = -M^2(d\alpha/dB)$$

$$R_L \to \infty \qquad \text{Eq. (26)}$$

$$\alpha M \neq 1$$

Equation (26) specifies that the avalanche multiplication factor M is modulated by a magnetic field and is related to $\alpha$ modulation by the factor $-M^2$. Modulation of avalanche multiplication may be an important aspect to remember when considering this effect on modulating localized injection efficiency.

Substituting the expression (dM/dB) Eq. (26) into Eq. (23), one obtains the following:

$$d(V_{MA})/dB = (-V_{MA}/N)[M_o(d\alpha/dB)] \qquad \text{Eq. (27)}$$

$R_1 \Delta \infty$

Equation (27) simply states that in the limit (large valued load resistors), the magnetic response signal obtained from the device is the result of modulating probability factor $\alpha$ by a magnetic field. The magnetic sensitivity $S_m$ of the device can be obtained by manipulating Eq. (27). The result is given by Eq. (28).

$$S_m = d(V_{MA})/V_{MA_0}) = -(M_o \alpha_o/N)(d\alpha.\alpha_o) \qquad \text{Eq. (28)}$$

$R_1 \to \infty$

Equation (28) defines the sensitivity of magnetically modulating the voltage at one collector of a device. The device is normally operated in the differential mode. The differential sensitivity $S_{MD}$, which includes effects of load impedance, is given by Eq. (29).

$$S_{MD} = -\frac{2M_o \alpha_o}{N}(\frac{d\alpha}{\alpha_o})\frac{R_L}{R_L + R_{DD}} \qquad \text{Eq. (29)}$$

The term $\alpha$ used in the above equations is usually defined in textbooks as the product $\gamma \alpha_T$ where Y is defined as the injection efficiency of the emtter and $\alpha_T$ is the transportation efficiency factor. In the literature, the transportation efficiency factor $\alpha_T$ is usually defined in terms of a common base bipolar transistor configuration. The transport factor $\alpha_T$ is a probability factor used herein to define device performance. It is equal to the probability that an injected minority carrier will be successfully delivered to the multiplication region close to the collectors. The probability of this event is quite low considering the density of holes leaving the collector region and moving toward the emitter. Remember, the holes (majority carrier) are generated by the process of impact ionization. As the holes return toward the emitter, a high instance of electron-hole recombination exists. The transport efficiency factor $\alpha_T$ consists of the product of three probability factors.

$$\alpha_T = P_1 P_2 P_3 \quad \text{Eq. (30)}$$

Where:

$P_1$ is the probability that a minority carrier injected at the emitter contact will reach the end of the emitter extension region, point A FIG. 7B, before recombining with a majority carrier generated by impact ionization. This factor is usually close to unity.

$P_2$ is the probability that an electron leaving the region at (emitted into the PN junction) the end (emissive junction) of the emitter extension region will successfully traverse the transportation efficiency control region $P_2$ and reach the edge of the depletion region formed in the vicinity of the collectors. The length of this region is determined by the total length L between the emitter and collectors and by the length of the emitter extender and will have an inverse relationship with probability factor $P_2$. This is the primary transportation efficiency control zone.

$P_3$ is the probability that an electron entering the edge of the depletion region will reach the multiplication region within the depletion region close to the stochastic junction formed at the collector diffusions. The edge of this region is the dominant recombination zone in which most recombination in this region occurs.

The probability factors $P_1$ and $P_2$ are believed to be relatively insensitive to modulation by magnetic fields due to the relatively low drift velocities of the carriers within their respective regions. However, the probability factor $P_3$ is quite susceptible to modulation by means of a magnetic field. Both majority (holes) and minority carriers (electrons) move at essentially saturation velocity $V_S = 10^7$ cm/sec within the depletion region surrounding the collector tips. Under these circumstances these carriers will readily respond to a Lorentz force $F = (q \cdot V_x) \times B$. The probability factor $P_3$ pertains only to events occurring within the depletion region. In light of the above argument and the definition given to $\alpha = \gamma \alpha_T$. The term $d\alpha/dB$ Eq. (27) can be defined in terms of $P_1$, $P_2$, $P_3$ and $\gamma$.

$$d\alpha/dB = \gamma(d\alpha_T/dB) + \alpha_T(d\gamma/dB) \approx \gamma P_1 P_2 (dP_3/dB) + \alpha_T(d\gamma/dB) \quad \text{Eq. (31)}$$

Substituting Eq. (31) into the sensitivity expression, Eq. (28) gives:

$$S_{M\alpha} = -\frac{M_o \alpha_o}{N} \left( \frac{d\alpha_T}{\alpha_T} + \frac{d\gamma}{\gamma} \right) \approx \frac{M_o \alpha_o}{N} \left( \frac{dP_3}{P_3} + \frac{d\gamma}{\gamma} \right) \quad \text{Eq. (32)}$$

Equation (32) reflects the situation that the magnetic sensitivity may not be due only to carrier deflection within the depletion region. Injection efficiency $\gamma$ may also be altered by the increase or decrease in majority carrier concentration along the sides and lower surface of the emitter extension region. It should be appreciated that the statistical trajectories of both holes and electrons are deflected in the same direction by action of a Lorentz force.

The probability factor $P_3$ is inversely proportional to the length of the depletion layer $l_d$, given by Eq. (5). Increasing the resistivity of the substrate increases the length of the depletion layer. This action lowers the probability factor $P_3$ while simultaneously increasing the percentage change in $P_3$ due to Lorentz action on holes and electrons. The details of the Lorentz deflection or carriers and the resulting potential redistribution in the depletion zone is a subtle mechanism and remains to be solved.

It is essential that the product $M\alpha$ have a steady state value of less than unity and preferably approximately 0.5. Otherwise the magnetic sensitivity will not have a maximum value. In general, $\alpha$ is subject to change as a function of collector current. However, careful design of the emitter extender region resistivity, length, and shape will allow the product $M\alpha$ to remain essentially constant and at the critical value throughout a substantial collector current range. These optimum conditions vary depending on the base resistivity used.

An alternate method of controlling the steady state product of $M\alpha$ is by using the base contact (8a in FIG. 7B). Placing a resistor between the emitter and base contact provides an effective means of lowering the injection efficiency of the emitter. The shunt resistance is adjusted for any collector current operating value such that the magnetic signal response is maximized. This device configuration is called the four terminal device. The sensitivity of the four terminal device is somewhat less than the preferred three terminal configuration.

ALTERNATIVE EMBODIMENTS OF MAGNETICALLY RESPONSIVE TRANSISTOR DEVICES

Figure 12A:
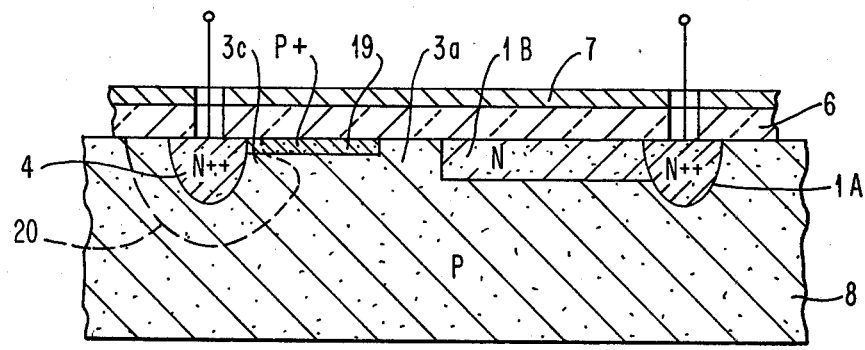
FIGS. 12A through 12C schematically illustrate, in horizontal cross-sections, various alternate embodiments of the transistor devices employed in the present invention.
Figure 12B:
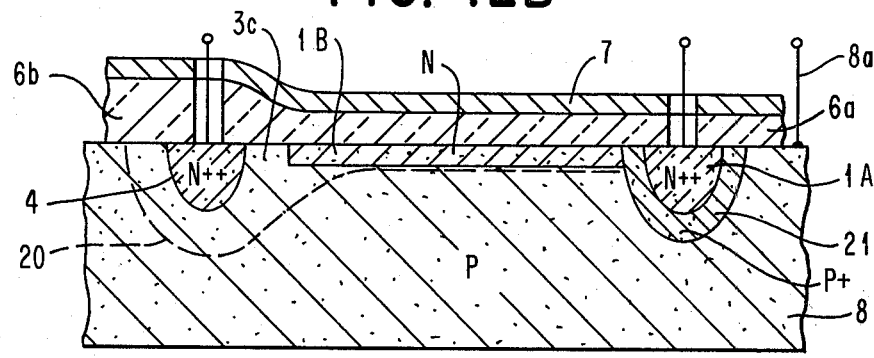
Figure 12C:
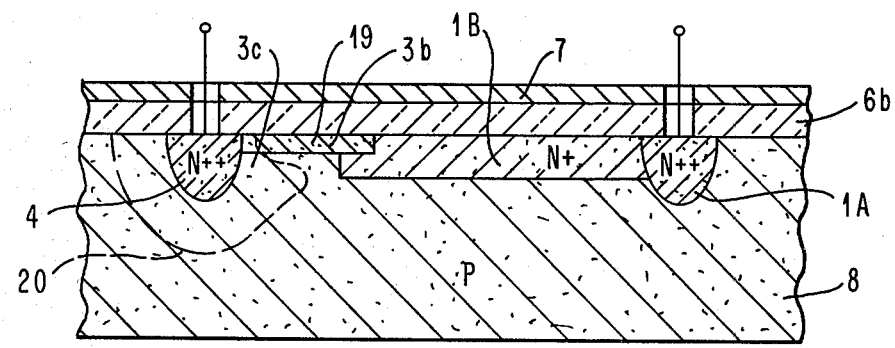

FIGS. 12A through 12C illustrate cross-sectional views of alternative embodiments of magnetically responsive devices. The plan view of these devices would be substantially like those of FIG. 7A with the differences as indicated in the following discussion.

The principal difference between the alternate devices shown in FIGS. 12A and 12C and those shown in FIGS. 7A, 7B and FIG. 8 is that the transportation efficiency control region and the ionization promotor means extend only part of the distance between the emitter 1-A and collectors 4. FIGS. 12A and 12C are similar and depict the effects of using a double implantation technique, i.e., both the ionization promotion means and the transportation efficiency control means are fabricated by an ion implantation technique. The ionization promotion and transportation efficiency control means 19 consists of a shallow boron implanted P+ type material. The implanted promotor region extends from the collectors 4 part of the way to the emitter 1. The effective acceptor concentration within the promotor implant region 19 should be greater than the acceptor concentration of the surrounding substrate material. As reflected by Eq. (6) above, the electric field at the stochastic PN junction located at the collector tips will increase in proportion to the square root of the acceptor concentration $N_A$ for a given collector voltage. Impact ionization will occur only at the collectors in the vicinity of the ionization promotor implant 19. The reason for this is that, at breakdown, the electric field within the depletion region of the promotor implant area 19 will be significantly higher than the field within the P type substrate material surrounding the collector tips. Impact ionization will occur only at a given controlled avalanche voltage as described by Eq. (8) and in the vicinity of the collector on the sides thereof facing the emitter 1 and corresponding to the P+ N++ stochastic junction.

The boron implant 19 may, in the alternative, be implanted deeply, i.e., to the full depth of the collectors, thus forming a conduction region between the emitter and collectors. If this is done, the implant serves three functions simultaneously. The implant serves first as an ionization promoter, secondly as a transportation efficiency control means and, thirdly, it serves as a means of altering the injection efficiency if it extends to the vicinity of the emitter interface. The deep implant may be overlaid with a shallow implant of $N^+$ type material to create an isolation of the main conductive zone from the surface of the substrate to reduce surface recombination effects and the resultant noise which it produces. This technique is most effective for constructing very high sensitivity magnetic devices by using high resistivity substrate materials, i.e., above 1 on ohm cm material. In such circumstances, the injection efficiency is normally too great and must be reduced by a $P^+$ pocket as described herein or by the deep $P^+$ implant technique just described. The length and resistivity of the $L_2$ region which this implant occupies on FIG. 18, of course control the transportation efficiency in this zone as well as serving as ionization promoter and as an injection efficiency control. The injection efficiency control function is a result of the minority carrier acceptor concentration change at the interface between the implant and the emitter on the end of the emitter extension region.

Also shown in FIG. 12A is an emitter extension region 1b which acts as an emitter and is the injection efficiency control implant region. Unlike the device illustrated in FIG. 12C, this implant region extends from the emitter 1a only part of the distance between the emitter and the collectors. This emitter extension region or injection control region is deeper than the ionization promotor region 19 and is achieved by implanting phosphorous ions at an energy level substantially greater than that used for implanting the promoter region 19. As used in the present discussion, "deep" regions are greater than 1 micron below the surface of the substrate and "shallow" regions are on the order of 1000 A or 0.1 microns.

FIG. 12B illustrates a magnetic sensor device with a P+ type pocket of material formed around the N++ emitter diffusion area. Such a pocket could also be used to surround the emitter extension region as in FIG. 18. This P+ region at the emitter is useful in controlling the potential of the base region relative to that of the emitter. This has a significant effect on injection efficiency of minority carriers into the semiconductor. It is essential to proper magnetic sensor operation that the base potential be greater than the emitter potential. The nominal desired potential for this voltage given two ohm centimeter silicon base material is approximately 700 millivolts. Alternate methods are available for guaranteeing that the critical base to emitter potential is achieved.

Figure 13A:
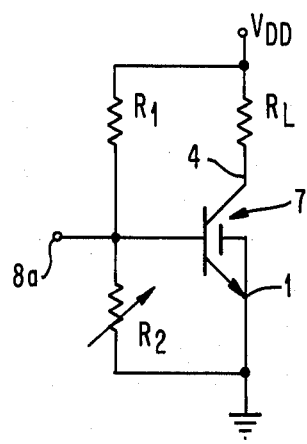
FIG. 13A illustrates schematically an alternate method for creating the critical base to emitter potentials for operation of the invention herein.

One method requires the use of a separate base contact 8A and a fourth terminal as shown in FIG. 13 which is used to actively or passively bias the base to emiitter junction to the optimal value. In FIG. 13A, resistors $R_1$ and $R_2$ are used for this purpose. However, by proper choice of device geometry and implantation conditions for the ionization promoter and for the life time control regions and for a given base resistivity, it is possible to achieve the critical base to emitter junction potential in the range of 600 to 800 millivolts without the use of a fourth terminal 8A. That is, the device may be made self-biasing. The preferred embodiment for the magnetic sensor is a self-biasing or three-terminal configuration having two collector contacts and one emitter contact.

FIG. 12C illustrates a device similar to that shown in FIGS. 7A, 7B and 12A in which the ionization promotion means consists of a Boron implant region 19. The emitter extension region is shown to extend from the emitter 1a along part of the distance towards the collectors and touches the impact ionization promoter implant 19.

Figure 14A:
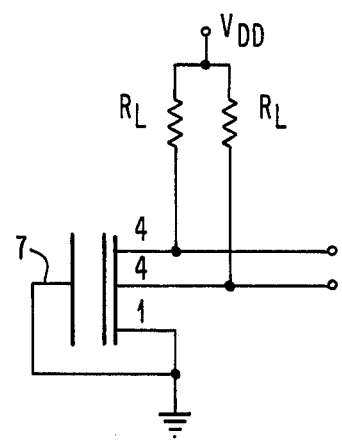
FIGS. 14A through 14C illustrate other preferred alternative circuit connections for operating the devices of the present invention.
Figure 14B:
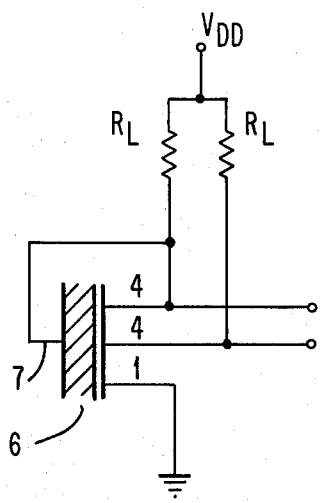
Figure 14C:
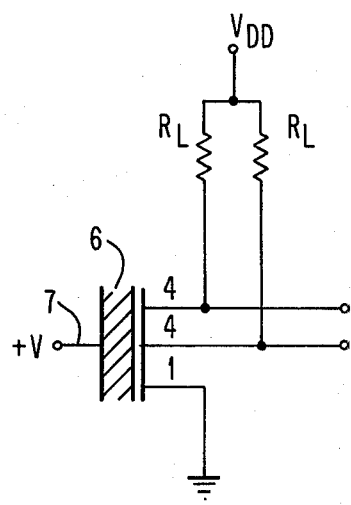

While operating the magnetic sensor configuration described herein, the accelerator or shield electrode 7 which aids in ionization may be connected to the emitter 1, (to ground) to one of the collectors 4, or to any source of potential. These situations are illustrated in FIGS. 14A through 14C.

Operating the device of FIG. 7A with the potential applied to the accelerator electrode 7 which is at a level above the threshold potential for the device, creates an inversion layer in the substrate surface beneath the electrode. The inversion layer may drive the majority carrier recombination region below the surface and this has been found to effectively reduce surface recombination noise.

Figure 17:
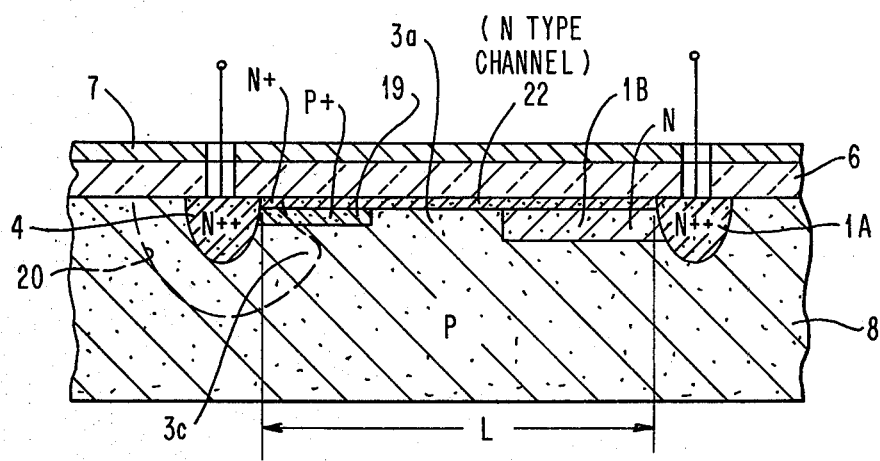
FIG. 17 illustrates a preferred embodiment of the invention similar to FIG. 12A with the exception that a noise reduction region is provided at the surface of the base and extending between the collector and emitter.

Essentially, the same reduction in surface recombination noise can be achieved by implanting a shallow phosphorous (minority carrier) region extending at least part of the distance between emitter and collectors. The implant dose and energy are adjusted to create the same carrier concentration at the surface as that within the inversion layer created by action of a accelerator voltage. Such a configuration is illustrated in FIG. 17 where the minority carrier region 22 extends the entire distance between emitter 1 and collector 4.

VOLTAGE LIMITING TRANSISTOR CHARACTERISTICS

The fundamental characteristics for a voltage limiting avalanche voltage transistor of the type contemplated herein have been previously given. The voltage limiting transistor device requires satisfaction simultaneously of fundamental structural requirements as follows:

Namely, the impact ionization promotion means must extend at least part of the distance between the collector and the emitter and the intrinsic high resistivity region, which can be or is depleted, must be formed within the semiconductor to extend at least part of the distance between the collector and the emitter. The depletion region occupies an area with finite depth below the surface of the semiiconductive region separating the collector and emitter. The depleted region conducts majority carriers (holes for NPN devices) created by ionization action and may be contiguous with and below the ionization promoter means.

Figure 15A:
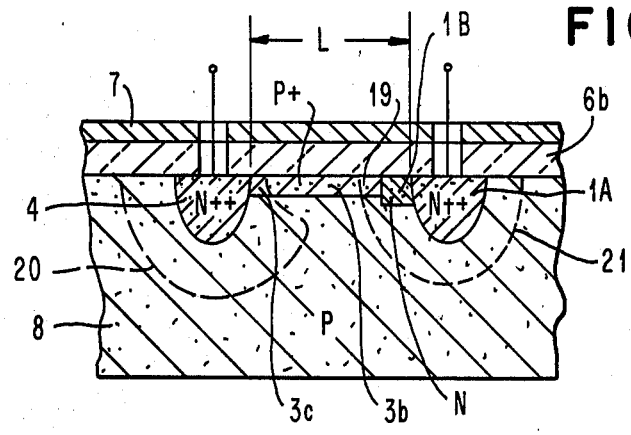
FIGS. 15A and 15B illustrate, respectively, a horizontal cross-section of a transistor device of the preferred type in the present invention and a plan view thereof as embodied in a device specifically adepted for creating a controlled avalanche voltage breakdown.
Figure 15B:
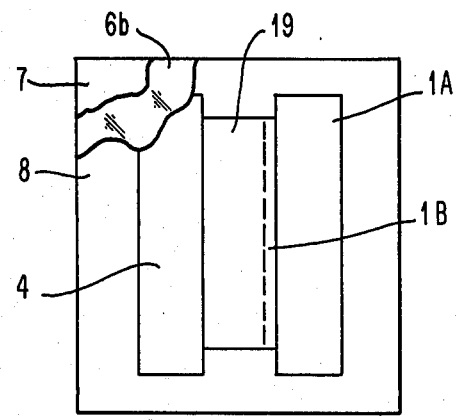

FIG. 15 depicts one method of satisfying these requirements by defining a VLT device. As illustrated in FIGS. 15A and 15B, a collector 4 and an emitter 1 are introduced by diffusion into a relatively high resistivity base substrate material 8. The emitter 1a and extension 1b and the collector 4 are both formed with highly doped N type material and are spaced apart from one another by a length L. Region 1b is doped to a different acceptor concentration than emitter 1a and collector 4.

This controls the resistivity of the injection efficiency control region. The substrate (base) material is P type having a relatively high resistivity, i.e., 5 ohm centimeters. An impact ionization promotion means 19 consists of a boron implant implanted to a depth of approximately 1000 Angstrom units and having an acceptor concentration $N_1$ substantially greater than that of the substrate material 8. A conductive shield 7 is illustrated in FIG. 15A as spaced apart from the substrate by a surface of relatively thick oxide layer 6B. Shield 7 eliminates electro magnetic radiation from impinging on the region between the emitter 1a and collector 4. The application of a reversed bias potential to collector 4 which causes a depletion layer 20 to extend from the collector below the promotor region 19 part of the distance to the forward biased emitter diffusion 1a. The length of the depletion region formed at the collector in the vicinity of the promotion means 19 is relatively short. The electric field in this region, particularly at the stochastic PN junction, is high enough to cause localized impact ionization to occur there only. Substantially all of the holes generated by the impact ionization process will return to the emitter within the depletion region 20 below the promotion means 19. The avalanche breakdown properties of this device were illustrated in FIG. 2 and repeated in FIG. 16.

Figure 16:
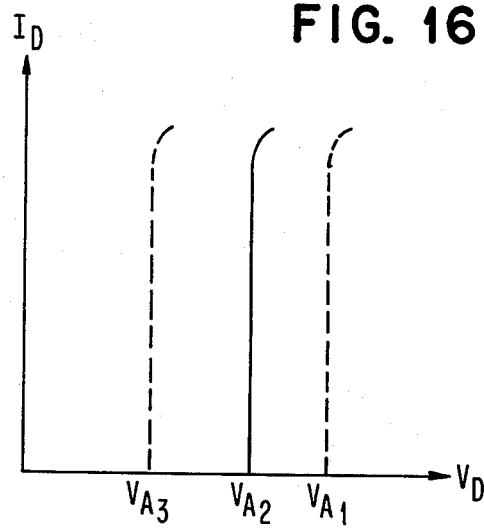
FIG. 16 illustrates the collector voltage and current characteristics for a device as described with relationship to FIGS. 15A and 15B and shows various alternative breakdown voltages that may be obtained for various physical parameters as described.

As will be seen in FIG. 16, various avalanche voltage breakdown properties can be constructed by varying the choice of acceptor concentration implanted within the promoter layer 19. FIG. 16 also illustrates the zero impedance avalanche characteristic provided by satisfying the condition that a majority of the recombining holes occur at the edge of the depletion layer 20. If this were not the case, the product of the probability factor $\alpha$ and the ionization multiplication factor M would be close to unity. Of course, these devices also exhibit magnetic responsiveness best utilized, however, in dual collector configurations.

A P+ pocket 21 may be used to enclose the emitter diffusion as a means to lower the injection efficiency of the emitter when substrates with high resistivity are used.

Figure 18:
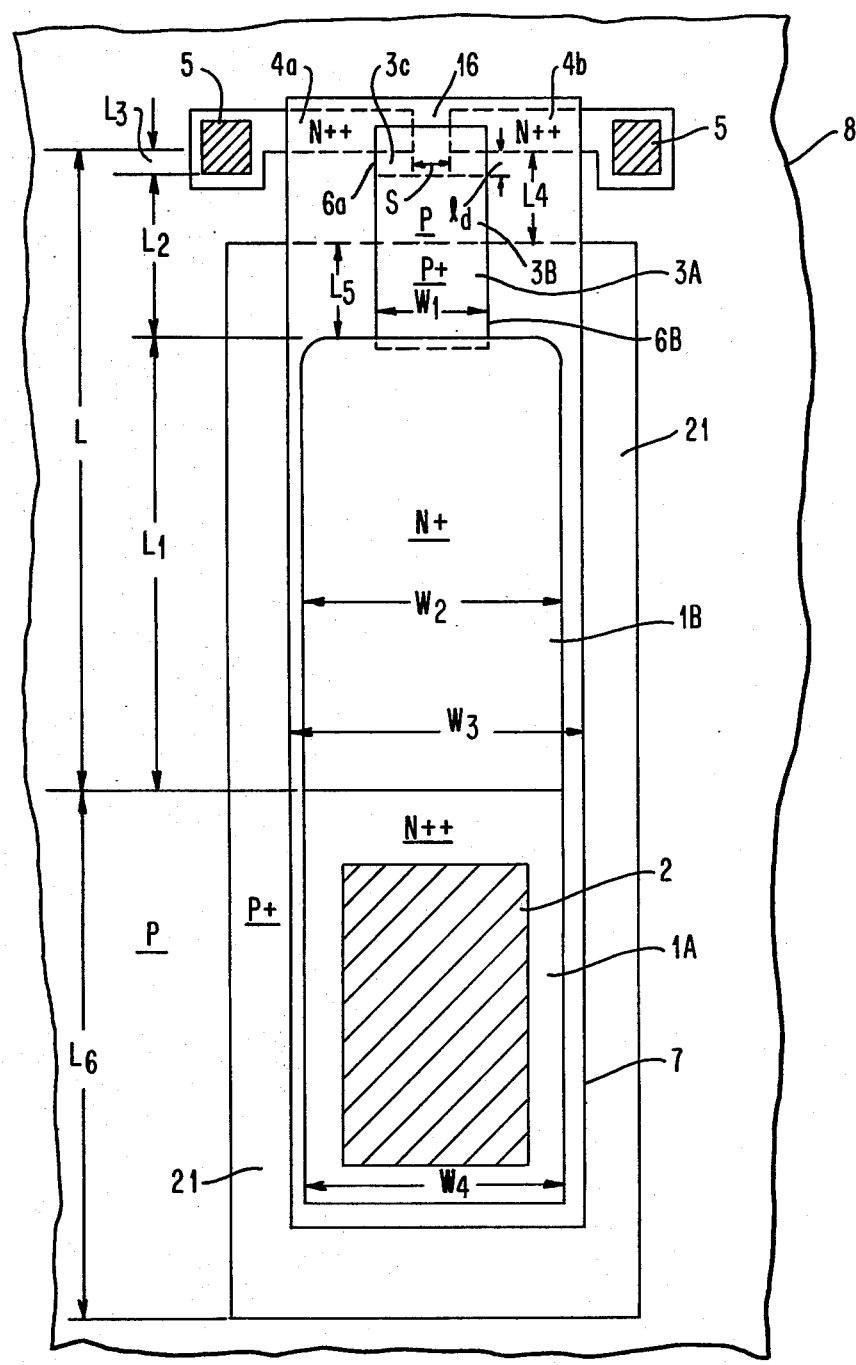
FIG. 18 illustrates an alternative preferred embodiment of a magnetically variable avalanche voltage transistor according to the invention.

In FIG. 18, a preferred embodiment showing all of the critical aspects of the magnetically responsive device requirements and functional elements are summarized. Silicon substrate 8 is provided with heavily N++ doped emitter and collector diffusions 1a, 4a and 4b, respectively. Injection efficiency control via the emitter extension region 1b doped to a lighter degree N+ is provided. A transportation efficiency control or transportation efficiency adjusting region 3a and 3b is also provided. It will be noted that the total critical length L is comprised of lengths $L_1$, $L_2$ and $L_3$. $L_1$ is the length of the injection efficiency control region. $L_2$ is the length of the recombination rate control region and $L_3$ is the length of the depletion region where all of the ionization and most of the recombination occurs. A P+ pocket 21 to reduce noise and partially control the injection efficiency is also shown. In region 3a, which lies in the P+ pocket region 21, some recombination control can be realized by varying the length of the zone. More recombination control can be obtained in 3b. The length of section $L_2$ is controlled by varying the total length L to achieve the desired recombination factor $\alpha$ as detailed earlier and is the primary transportation efficiency control region.

The following lists the various device criticalities and prescribes a nominal value for each as shown in FIG. 18.

The collector tips are identified as regions 4a and 4b. These regions are diffused and are typically 0.8 microns deep, 2.5 microns high and exhibit a resistivity of 80 ohms per square. Slit S (16) is the separation distance between the collectors and is typically 1.2 microns.

Width $W_1$ defines the breadth of the thin oxide region 3 which extends from the emitter extension region 1-B and intercepts the collectors 4-a and 4-b. A typical width for $W_1$ is 300$\mu$ inches. The width $W_2$ of the emitter extension region is typically twice as wide as the channel region 3.

$L_1$ is the length of the emitter extender 1-b and can be varied to control its resistance. Its resistance also depends on the resistivity of the material used in its fabrication. An aspect ratio $L_1/W_2 = 1.3$ for the emitter extender has been found to produce good results.

Figure 19:
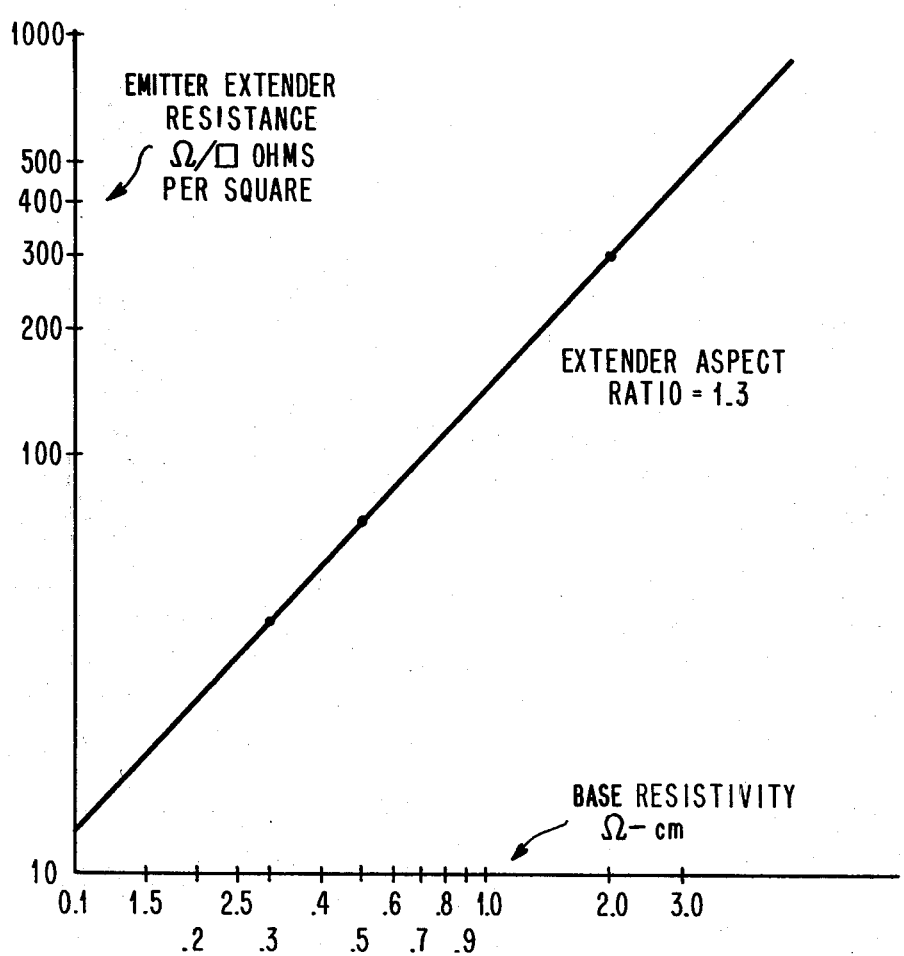
FIG. 19 illustrates a chart of emitter extender resistance versus base resistance for optimum performance of a device as described with relationship to FIG. 18.

FIG. 19 illustrates a graph which plots the required critical resistance, ohms per square, of the emitter extender 1-b as a function of the resistivity of the base 3 or substrate 8, given an aspect ratio of 1.3. If the emitter extender impedance is too low for a given substrate or base resistivity, a negative resistance avalanche property will result. It should be understood that the ohms per square dimension is the resistance of a square of material where its length and width are equal, i.e., $L_1/W_2 = 1$ to define ohms per square. Resistance $= (\rho/T) L_1/W_2 =$ ohms.

The length $L_2$ of base region 3 is also important to achieving the critical avalanche volt-current properties of FIG. 4. This region controls transport efficiency and has a nominal length of about 800$\mu$ inches given an emitter extender aspect ratio of 1.3. Gold doping within this region may be used to increase dislocation density and thus decrease transport efficiency and allow $L_2$ to be shorter. $L_6$ is slightly longer than the length of the heavily doped source region 1-2. In order to make good electrical contact to the emitter diffusion area, this region should have a resistance of about 10 ohms per square. The length $L_4$ of this region is approximately the same as length $L_1$ of the emitter extender.

$L_3$ is the length of the depletion region formed in front of collector tips 4a and 4b. The length of this depletion layer obeys Eq. (5).

$W_4$ is the width of the emitter region 1-a and can be made to be equal to the width $W_2$ of the emitter extender region 1-b. The width $W_3$ of electrode 7 should be greater than the width of the emitter extender region 1-b.

The length of electrode 7 should extend the entire length of the structure as illustrated in FIG. 18 and as shown, can be an integral part of the contact area 2.

Region 21, FIG. 18, consists of a majority carrier type material forming a pocket into which the emitter and emitter extender material may be placed when used. The resistivity of pocket 21 should be less than the resistivity of substrate 8. The resistivity of this region should be approximately 0.5 ohms cm. As shown in FIG. 18, region 21 extends beyond the emitter extender 1-b by a distance $L_5$. Length $L_5$ is typically one-half the distance $L_2$.

With reference to Eq. (1) above, it must be emphasized that the product $M \cdot \alpha$ must remain essentially constant for a substantial collector current range. When the product, $M \cdot \alpha$, is mainained independent of collector current, the desired vertical volt-current characteristics are obtained as illustrated in FIG. 2, FIG. 4A, 4B and FIG. 16. Under the circumstances, the dual collector device FIG. 7A, FIG. 13B, and FIG. 18, exhibit the maximum magnetic responsiveness.

It has been shown that the electron-hole recombination probability factor $\alpha$ has been defined to be the product of injection efficiency $\gamma$ and transportation efficiency factor $\alpha_T$ i.e., $\alpha = \gamma \alpha_T$. The injection efficiency is typically less than unity and is controlled by the emitter extension region 1-b, FIG. 18, defined as the injection efficiency control region. Injection efficiency is proportional to the percentage of minority carriers injected across the end of region 1-b facing the collectors relative to total injection about the surface of region 1-b in contact with the surrounding majority carrier type material. Injection efficiency is inversely proportional to the longitudinal resistance of region 1-b and the acceptor concentration into which this region is placed. The longitudinal resistance of the controlled injection region is determined by its length, width, depth and the minority carrier donor concentration used in its fabrication.

The transport factor $\alpha_T$ Eq. (30) was defined as the product of three probability factors $P_1$, $P_2$, $P_3$. Probability factor $P_1$ is controlled by region 1b. Recombination within this region, however, is quite small and has little effect on controlling the transport factor $\alpha_T$. Probability factor $P_2$, however, is inversely proportional to length $L_2$, FIG. 18, and the minority carrier acceptor concentration $N_A$ within this region. Both parameters $L_2$ and $N_A$ can be controlled by device design to affect the probability factor $P_2$ and thus effectively scale the product M·$\alpha$. Probability factor $P_3$ describes events taking place at the edge of the depletion region, (length $L_3$ of region $C_3$, FIG. 18). This probability factor can be quite low and approaches the value 1/M at the collectors where M is defined as the avalanche current multiplication factor. Probability factor $P_3$ is a function of collector current and the avalanche voltage $V_{MA}$. Since it is desired that the voltage $V_{MA}$ be independent of current, probability factor $P_3$ is a spontaneous event and therefore cannot be easily controlled by physical device parameters.

However, injection efficiency $\gamma$ and probability factors $P_1$ and $P_2$ do affect the recombination rate which produces the net transportation efficiency observed within the depletion region. These factors are therefore the principal means for optimizing device behavior.

Figure 13B:
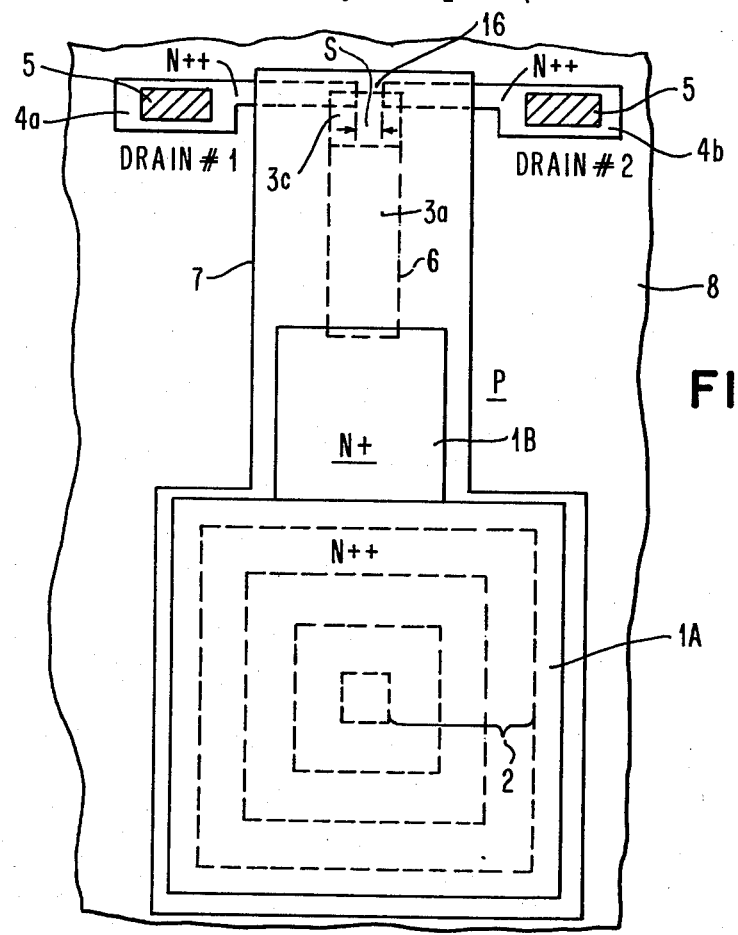
FIG. 13B illustrates an enlarged view of preferred embodiment of a magnetically responsive device according to the invention.

It has been determined experimentally that the magnetic sensitivity of the dual collector device FIG. 7A, FIG. 13B, and FIG. 18 increases inversely with acceptor concentration within region 3C. In order to achieve very high magnetic sensitivity, it is desirable to utilize substrates with high resistivity, typically greater than 2 ohms cm. When substrates with high resistivity are used, the ability to scale the product M·$\alpha$ due to the increase in injection efficiency $\gamma$ and probability factor $P_2$ is reduced.

To alleviate this situation, a P+ pocket, region 21, FIG. 18, is used. This pocket is shown to totally encompass both emitter regions 1a and 1b and to occupy approximately half of region 3 between the end of the emitter extender 1-b and collectors 4. Control of probability factor $P_2$ is regained in region 3-A and control of injection efficiency $\gamma$ is regained by the N+P+ boundary condition formed about the emitter extender PN junction. Use of the P+ pocket technique allows proper control of the product M·$\alpha$ given high substrate resistivities and simultaneously provides a means of increasing magnetic sensitivity. When using the P+ pocket technique, the distance $L_4$, FIG. 18, must be at least equal to the length $l_d$ of the depletion layer formed at the collectors, otherwise the value of utilizing substrates with high resistivity is lost. The P+ pocket is introduced to the substrate by use of ion implant techniques. A depth of approximately 3 microns is appropriate and is obtained by allowing the implant to diffuse by use of a suitable anneal temperature time profile. A P+ pocket which exhibits a 0.5 ohms cm resistivity is a reasonable compromise.

Having thus described and illustrated my invention with reference to preferred embodiments thereof, it should be clearly understood by those of skill in the art that numerous alternative means for providing injection efficiency control, transportation efficiency control and impact ionization promotion may be provided as alternatives to those discussed herein wherefor the invention is more broadly defined and for which protection is sought as identified in the appended claims.

Having thus described my invention, what I claim as new, and desire to secure by Letters Patent is:

1. An avalanche transistor having a base region of first conductivity type and spaced emitter and collector regions of second conductivity type forming respective PN junctions with said base region, said emitter and collector regions being connected to a source of electrical potential of proper polarity and magnitude to forward bias the emitter-base junction and to reverse bias the collector-base junction into avalanche generation of excess minority and majority carriers in said base region, said collector collecting said minority carriers;

a region of second conductivity type having a higher resistivity than said emitter region and extending from said emitter toward said collector region, said region of second conductivity type separating said emitter from said base region only at the portion of said emitter-base junction facing said collector-base junction, a localized impact ionization promoter means for facilitating the creation of an area of local covalent bond ruptures in the portion of the total area of said collector base junction lying closest to said emitter, said promoter means affecting a portion of said area which is smaller than the total portion thereof which lies closest to said emitter, said promoter means extending from said collector-base junction area towards said emitter and serving to increase the local energy density in said smaller area to produce, upon supply of said area with said minority carriers from said emitter, an abruptly conducting avalanche current generation of excess minority and majority carriers in an M-factored multiplication process occurring at a characteristic voltage applied between said emitter and collector contacts.

2. A transistor as described in claim 1, wherein:

the product of said injection efficiency times said transportation efficiency multiplied by said M-factor lies in the range between less than unity and approximately one-half.

3. A transistor as described in claim 1, wherein said impact ionization promoter means comprises:

an area of electrically conductive material overlying a portion of said base-collector junction spaced apart from said base and said collector by an electrical insulator, said conductive material being connected to a source of electrical potential at a level referenced with respect to that potential applied to said collector contact to create an electric field between said area of conductive material and said collector that accelerates said minority carriers from said emitter towards said collector and also raises the energy density in said smaller area to a level which facilitates impact ionization ruptures of the covalent bonds of said smaller area of base-collector junction material by said minority carriers to produce said factored multiplication avalanche current generation.

4. A transistor as described in claim 2, wherein said impact ionization promoter means comprises:
an area of electrically conductive material overlying a portion of said base-collector junction spaced apart from said base and said collector by an electrical insulator, said conductive material being connected to a source of electrical potential at a level referenced with respect to that potential applied to said collector contact to create an electric field between said area of conductive material and said collector that accelerates said minority carriers from said emitter towards said collector and also raises the energy density in said smaller area to a level which facilitates impact ionization ruptures of the covalent bonds of said smaller area of base-collector junction material by said minority carriers to produce said factored multiplication avalanche current generation.

5. A transistor as described in claim 3 or 4, wherein:
said area of conductive material is spaced closer to the surface of said base in said vicinity of said collector-base junction than over other regions of said base and said collector-base junction.

6. A transistor as described in claim 1, in which said impact ionization promotor means further comprises:
a region of altered majority carrier concentration material in said base and in contact with said smaller area of said collector-base junction, said region having a higher majority carrier concentration than that of the base material surrounding it.

7. A transistor as described in claim 2, in which said impact ionization promotor means further comprises:
a region of altered majority carrier concentration material in said base and in contact with said smaller area of said collector-base junction, said region having a higher majority carrier concentration than that of the base material surrounding it.

8. A transistor as described in claim 3, in which said impact ionization promotor means further comprises:
a region of altered majority carrier concentration material in said base and in contact with said smaller area of said collector-base junction, said region having a higher majorityy carrier concentration than that of the base material surrounding it.

9. A transistor as described in claim 4, in which said impact ionization promotor means further comprises:
a region of altered majority carrier concentration material in said base and in contact with said smaller area of said collector-base junction, said region having a higher majority carrier concentration than that of the base material surrounding it.

10. A transistor as described in claim 6, or 7, or 8, or 9, wherein:
said region of altered majority carrier concentration material in said base comprises an ionically implanted zone of majority carrier material.

11. A transistor as described in claim 1, or 2, or 3, or 4, or 6, or 7, or 8, or 9, having an injection efficiency and means for controlling said injection efficiency, comprising:
means for modifying the forward bias potential at said emitter-base junction.

12. A transistor as described in claim 1, having an injection efficiency and means for controlling said injection efficiency, comprising:
a region of altered majority carrier concentration material surrounding said emitter in which region said concentration differs from that of said base and from that of said emitter and creates a junction contact potential between said emitter and said base which differs from that normally existing directly between said emitter and said base.

13. A transistor as described in claim 2, having an injection efficiency and means for controlling said injection efficiency, comprising:
a region of altered majority carrier concentration material surrounding said emitter in which region said concentration differs from that of said base and from that of said emitter and creates a junction contact potential between said emitter and said base which differs from that normally existing directly between said emitter and said base.

14. A transistor as described in claim 3, having an injection efficiency and means for controlling said injection efficiency, comprising:
a region of altered majority carrier concentration material surrounding said emitter in which region said concentration differs from that of said base and from that of said emitter and creates a junction contact potential between said emitter and said base which differs from that normally existing directly between said emitter and said base.

15. A transistor as described in claim 4, having an injection efficiency and means for controlling said injection efficiency, comprising:
a region of altered majority carrier concentration material surrounding said emitter in which region said concentration differs from that of said base and from that of said emitter and creates a junction contact potential between said emitter and said base which differs from that normally existing directly between said emitter and said base.

16. A transistor as described in claim 6, having an injection efficiencyy and means for controlling said injection efficiency, comprising:
a region of altered majority carrier concentration material surrounding said emitter in which region said concentration differs from that of said base and from that of said emitter and creates a junction contact potential between said emitter and said base which differs from that normally existing directly between said emitter and said base.

17. A transistor as described in claim 7, having an injection efficiency and means for controlling said injection efficiency, comprising:
a region of altered majority carrier concentration material surrounding said emitter in which region said concentration differs from that of said base and from that of said emitter and creates a junction contact potential between said emitter and said base which differs from that normally existing directly between said emitter and said base.

18. A transistor as described in claim 8, having an injection efficiency and means for controlling said injection efficiency, comprising:
- a region of altered majority carrier concentration material surrounding said emitter in which region said concentration differs from that of said base and from that of said emitter and creates a junction contact potential between said emitter and said base which differs from that normally existing directly between said emitter and said base.

19. A transistor as described in claim 9, having an injection efficiency and means for controlling said injection efficiency, comprising:
- a region of altered majority carrier concentration material surrounding said emitter in which region said concentration differs from that of said base and from that of said emitter and creates a junction contact potential between said emitter and said base which differs from that normally existing directly between said emitter and said base.

20. A transistor as described in claim 1, having an injection efficiency and means for controlling said injection efficiency, comprising:
- a region of material of type opposite to said base and in distributed area contact with said emitter and with said base at said contacts therewith, said region having a controlled internal resistance between said emitter contact area and the farthest extending portion of said region in the direction towards said collector.

21. A transistor as described in claim 2, having an injection efficiency and means for controlling said injection efficiency, comprising:
- a region of material of type opposite to said base and in distributed area contact with said emitter and with said base at said contacts therewith, said region having a controlled internal resistance between said emitter contact area and the farthest extending portion of said region in the direction towards said collector.

22. A transistor as described in claim 3, having an injection efficiency and means for controlling said injection efficiency, comprising:
- a region of material of type opposite to said base and in distributed area contact with said emitter and with said base at said contacts therewith, said region having a controlled internal resistance between said emitter contact area and the farthest extending portion of said region in the direction towards said collector.

23. A transistor as described in claim 4, having an injection efficiency and means for controlling said injection efficiency, comprising:
- a region of material of type opposite to said base and in distributed area contact with said emitter and with said base at said contacts therewith, said region having a controlled internal resistance between said emitter contact area and the farthest extending portion of said region in the direction towards said collector.

24. A transistor as described in claim 6, having an injection efficiency and means for controlling said injection efficiency, comprising:
- a region of material of type opposite to said base and in distributed area contact with said emitter and with said base at said contacts therewith, said region having a controlled internal resistance between said emitter contact area and the farthest extending portion of said material in the direction towards said collector.

25. A transistor as described in claim 7, having an injection efficiency and means for controlling said injection efficiency, comprising:
- a region of material of type opposite to said base and in distributed area contact with said emitter and with said base at said contacts therewith, said region having a controlled internal resistance between said emitter contact area and the farthest extending portion of said region in the direction towards said collector.

26. A transistor as described in claim 8, having an injection efficiency and means for controlling said injection efficiency, comprising:
- a region of material of type opposite to said base and in distributed area contact with said emitter and with said base at said contacts therewith, said region having a controlled internal resistance between said emitter contact area and the farthest extending portion of said region in the direction towards said collector.

27. A transistor as described in claim 9, having an injection efficiency and means for controlling said injection efficiency, comprising:
- a region of material of type opposite to said base and in distributed area contact with said emitter and with said base at said contacts therewith, said region having a controlled internal resistance between said emitter contact area and the farthest extending portion of said region in the direction towards said collector.

28. A transistor as described in claim 12, having an injection efficiency and means for controlling said injection efficiency, comprising:
- a region of material of type opposite to that of said base and in distributed area contact with said emitter and with said base at said contacts therewith, said region extending from said emitter through said region of altered majority carrier concentration material surrounding said emitter in a direction toward said collector, said region of material of type opposite to that of said base having a controlled internal resistance between said emitter area contact and the farthest surface of said region extending in the direction of said collector.

29. A transistor as described in claim 13, having an injection efficiency and means for controlling said injection efficiency, comprising:
- a region of material of type opposite to that of said base and in distributed area contact with said emitter and with said base at said contacts therewith, said region extending from said emitter through said region of altered majority carrier concentration material surrounding said emitter in a direction toward said collector, said region of material of type opposite to that of said base having a controlled internal resistance between said emitter area contact and the farthest surface of sid region extending in the direction of said collector.

30. A transistor as described in claim 14, having an injection efficiency and means for controlling said injection efficiency, comprising:
- a region of material of type opposite to that of said base and in distributed area contact with said emitter and with said base at said contacts therewith, said region extending from said emitter through said region of altered majority carrier concentration material surrounding said emitter in a direction toward said collector, said region of material of type opposite to that of said base having a controlled internal resistance between said emitter area contact and the farthest surface of said region extending in the direction of said collector.

31. A transistor as described in claim 15, having an injection efficiency and means for controlling said injection efficiency, comprising:
a region of material of type opposite to that of said base and in distributed area contact with said emitter and with said base at said contacts therewith, said region extending from said emitter through said region of altered majority carrier concentration material surrounding said emitter in a direction toward said collector, said region of material of type opposite to that of said base having a controlled internal resistance between said emitter area contact and the farthest surface of said region extending in the direction of said collector.

32. A transistor as described in claim 16, having an injection efficiency and means for controlling said injection efficiency, comprising:
a region of material of type opposite to that of said base and in distributed area contact with said emitter and with said base at said contacts therewith, said region extending from said emitter through said region of altered majority carrier concentration material surrounding said emitter in a direction toward said collector, said region of material of type opposite to that of said base having a controlled internal resistance between said emitter area contact and the farthest surface of said region extending in the direction of said collector.

33. A transistor as described in claim 17, having an injection efficiency and means for controlling said injection efficiency, comprising:
a region of material of type opposite to that of said base and in distributed area contact with said emitter and with said base at said contacts therewith, said region extending from said emitter through said region of altered majority carrier concentration material surrounding said emitter in a direction toward said collector, said region of material of type opposite to that of said base having a controlled internal resistance between said emitter area contact and the farthest surface of said region extending in the direction of said collector.

34. A transistor as described in claim 18, having an injection efficiency and means for controlling said injection efficiency comprising:
a region of material of type opposite to that of said base and in distributed area contact with said emitter and with said base at said contacts therewith, said region extending from said emitter through said region of altered majority carrier concentration material surrounding said emitter in a direction toward said collector, said region of material of type opposite to that of said base having a controlled internal resistance between said emitter area contact and the farthest surface of said region extending in the direction of said collector.

35. A transistor as described in claim 19, having an injection efficiency and means for controlling said injection efficiency, comprising:
a region of material of type opposite to that of said base and in distributed area contact with said emitter and with said base at said contacts therewith, said region extending from said emitter through said region of altered majority carrier concentration material surrounding said emitter in a direction toward said collector, said region of material of type opposite to that of said base having a controlled internal resistance between said emitter area contact and the farthest surface of said region extending in the direction of said collector.

36. A transistor as described in claim 1, and further comprising:
at least two said collectors, said collectors being separated from one another by a distance which is less than the distance separating them from said emitter, said collectors being symmetrically placed with respect to a line bisecting said separation distance between said collectors and joining the center of said emitter means, said line bisecting said impact ionization promotor means and defining a center line of a conductive zone extending from said emitter to said collectors.

37. A transistor as described in claim 2, and further comprising:
at least two said collectors, said collectors being separated from one another by a distance which is less than the distance separating them from said emitter, said collectors being symmetrically placed with respect to a line bisecting said separation distance between said collectors and joining the center of said emitter means, said line bisecting said impact ionization promotor means and defining a center line of a conductive zone extending from said emitter to said collectors.

38. A transistor as described in claim 3, and further comprising:
at least two said collectors, said collectors being separated from one another by a distance which is less than the distance separating them from said emitter, said collectors being symmetrically placed with respect to a line bisecting said separation distance between said collectors and joining the center of said emitter means, said line bisecting said impact ionization promotor means and defining a center line of a conductive zone extending from said emitter to said collectors.

39. A transistor as described in claim 4, and further comprising:
at least two said collectors, said collectors being separated from one another by a distance which is less than the distance separating them from said emitter, said collectors being symmetrically placed with respect to a line bisecting said separation distance between said collectors and joining the center of said emitter means, said line bisecting said impact ionization promoter means and defining a center line of a conductive zone extending from said emitter to said collectors.

40. A transistor as described in claim 6, and further comprising:
at least two said collectors, said collectors being separated from one another by a distance which is less than the distance separating them from said emitter, said collectors being symmetrically placed with respect to a line bisecting said separation distance between said collectors and joining the center of said emitter means, said line bisecting said impact ionization promoter means and defining a center line of a conductive zone extending from said emitter to said collectors.

41. A transistor as described in claim 7, and further comprising:
 at least two said collector means, said collector means being separated from one another by a distance which is less than the distance separating them from said emitter, said collector means being symmetrically placed with respect to a line bisecting said separation distance between said collectors and joining the center of said emitter means, said line bisecting said impact ionization promoter means and defining a center line of a conductive zone extending from said emitter to said collectors.

42. A transistor as described in claim 8, and further comprising:
 at least two said collector means, said collector means being separated from one another by a distance which is less than the distance separating them from said emitter, said collector means being symmetrically placed with respect to a line bisecting said separation distance between said collectors and joining the center of said emitter means, said line bisecting said impact ionization promoter means and defining a center line of a conductive zone extending from said emitter to said collectors.

43. A transistor as described in claim 9, and further comprising:
 at least two said collectors, said collectors being separated from one another by a distance which is less than the distance separating them from said emitter, said collectors being symmetrically placed with respect to a line bisecting said separation distance between said collectors and joining the center of said emitter means, said line bisecting said impact ionization promoter means and defining a center line of a conductive zone extending from said emitter to said collectors.

44. A transistor as described in claim 12, and further comprising:
 at least two said collectors, said collectors being separated from one another by a distance which is less than the distance separating them from said emitter, said collectors being symmetrically placed with respect to a line bisecting said separation distance between said collectors and joining the center of said emitter means, said line bisecting said impact ionization promoter means and defining a center line of a conductive zone extending from said emitter to said collectors.

45. A transistor as described in claim 13, and further comprising:
 at least two said collectors, said collectors being separated from one another by a distance which is less than the distance separating them from said emitter, said collectors being symmetrically placed with respect to a line bisecting said separation distance between said collectors and joining the center of said emitter means, said line bisecting said impact ionization promoter means and defining a center line of a conductive zone extending from said emitter to said collectors.

46. A transistor as described in claim 14, and further comprising:
 at least two said collectors, said collectors being separated from one another by a distance which is less than the distance separating them from said emitter, said collectors being symmetrically placed with respect to a line bisecting said separation distance between said collectors and joining the center of said emitter means, said line bisecting said impact ionization promoter means and defining a center line of a conductive zone extending from said emitter to said collectors.

47. A transistor as described in claim 15, and further comprising:
 at least two said collectors, said collectors being separated from one another by a distance which is less than the distance separating them from said emitter, said collectors being symmetrically placed with respect to a line bisecting said separation distance between said collectors and joining the center of said emitter means, said line bisecting said impact ionization promoter means and defining a center line of a conductive zone extending from said emitter to said collectors.

48. A transistor as described in claim 16, and further comprising:
 at least two said collectors, said collectors being separated from one another by a distance which is less than the distance separating them from said emitter, said collectors being symmetrically placed with respect to a line bisecting said separation distance between said collectors and joining the center of said emitter means, said line bisecting said impact ionization promoter means and defining a center line of a conductive zone extending from said emitter to said collectors.

49. A transistor as described in claim 17, and further comprising:
 at least two said collector means, said collectors being separated from one another by a distance which is less than the distance separating them from said emitter, said collectors being symmetrically placed with respect to a line bisecting said separation distance between said collectors and joining the center of said emitter means, said line bisecting said impact ionization promotor means and defining a center line of a conductive zone extending from said emitter to said collectors.

50. A transistor as described in claim 18, and further comprising:
 at least two said collectors, said collectors being separated from one another by a distance which is less than the distance separating them from said emitter, said collectors being symmetrically placed with respect to a line bisecting said separation distance between said collectors and joining the center of said emitter means, said line bisecting said impact ionization promotor means and defining a center line of a conductive zone extending from said emitter to said collectors.

51. A transistor as described in claim 19, and further comprising:
 at least two said collectors, said collectors being separated from one another by a distance which is less than the distance separating them from said emitter, said collectors being symmetrically placed with respect to a line bisecting said separation distance between said collectors and joining the center of said emitter means, said line bisecting said impact ionization promoter means and defining a center line of a conductive zone extending from said emitter to said collectors.

52. A transistor as described in claim 20, and further comprising:
 at least two said collectors, said collectors being separated from one another by a distance which is less than the distance separating them from said emitter, said collectors being symmetrically placed with respect to a line bisecting said separation distance between said collectors and joining the center of said emitter means, said line bisecting said impact ionization promotor means and defining a center line of a conductive zone extending from said emitter to said collectors.

53. A transistor as described in claim 21, and further comprising:
at least two said collectors, said collector means being separated from one another by a distance which is less than the distance separating them from said emitter, said collectors being symmetrically placed with respect to a line bisecting said separation distance between said collectors and joining the center of said emitter means, said line bisecting said impact ionization promotor means and defining a center line of a conductive zone extending from said emitter to said collectors.

54. A transistor as described in claim 22, and further comprising:
at least two said collectors, said collectors being separated from one another by a distance which is less than the distance separating them from said emitter, said collectors being symmetrically placed with respect to a line bisecting said separation distance between said collectors and joining the center of said emitter means, said line bisecting said impact ionization promotor means and defining a center line of a conductive zone extending from said emitter to said collectors.

55. A transistor as described in claim 23, and further comprising:
at least two said collectors, said collector means being separated from one another by a distance which is less than the distance separating them from said emitter, said collectors being symmetrically placed with respect to a line bisecting said separation distance between said collectors and joining the center of said emitter means, said line bisecting said impact ionization promotor means and defining a center line of a conductive zone extending from said emitter to said collectors.

56. A transistor as described in claim 24, and further comprising:
at least two said collectors, said collector means being separated from one another by a distance which is less than the distance separating them from said emitter, said collectors being symmetrically placed with respect to a line bisecting said separation distance between said collectors and joining the center of said emitter means, said line bisecting said impact ionization promotor means and defining a center line of a conductive zone extending from said emitter to said collectors.

57. A transistor as described in claim 25, and further comprising:
at least two said collectors, said collectors being separated from one another by a distance which is less than the distance separating them from said emitter, said collectors being symmetrically placed with respect to a line bisecting said separation distance between said collectors and joining the center of said emitter means, said line bisecting said impact ionization promotor means and defining a center line of a conductive zone extending from said emitter to said collectors.

58. A transistor as described in claim 26, and further comprising:
at least two said collectors, said collectors being separated from one another by a distance which is less than the distance separating them from said emitter, said collectors being symmetrically placed with respect to a line bisecting said separation distance between said collectors and joining the center of said emitter means, said line bisecting said impact ionization promotor means and defining a center line of a conductive zone extending from said emitter to said collectors.

59. A transistor as described in claim 27, and further comprising:
at least two said collectors, said collectors being separated from one another by a distance which is less than the distance separating them from said emitter, said collectors being symmetrically placed with respect to a line bisecting said separation distance between said collectors and joining the center of said emitter means, said line bisecting said impact ionization promotor means and defining a center line of a conductive zone extending from said emitter to said collectors.

60. A transistor as described in claim 28, and further comprising:
at least two said collectors, said collectors being separated from one another by a distance which is less than the distance separating them from said emitter, said collectors being symmetrically placed with respect to a line bisecting said separation distance between said collectors and joining the center of said emitter means, said line bisecting said impact ionization promotor means and defining a center line of a conductive zone extending from said emitter to said collectors.

61. A transistor as described in claim 29, and further comprising:
at least two said collectors, said collectors being separated from one another by a distance which is less than the distance separating them from said emitter, said collectors being symmetrically placed with respect to a line bisecting said separation distance between said collectors and joining the center of said emitter means, said line bisecting said impact ionization promotor means and defining a center line of a conductive zone extending from said emitter to said collectors.

62. A transistor as described in claim 30, and further comprising:
at least two said collector means, said collectors being separated from one another by a distance which is less than the distance separating them from said emitter, said collectors being symmetrically placed with respect to a line bisecting said separation distance between said collectors and joining the center of said emitter means, said line bisecting said impact ionization promotor means and defining a center line of a conductive zone extending from said emitter to said collectors.

63. A transistor as described in claim 31, and further comprising:
at least two said collector means, said collectors being separated from one another by a distance which is less than the distance separating them from said emitter, said collectors being symmetrically placed with respect to a line bisecting said separation distance between said collectors and joining the cen- 64. A transistor as described in claim 32, and further comprising:
at least two said collectors, said collectors being separated from one another by a distance which is less than the distance separating them from said emitter, said collectors being symmetrically placed with respect to a line bisecting said separation distance between said collectors and joining the center of said emitter means, said line bisecting said impact ionization promotor means and defining a center line of a conductive zone extending from said emitter to said collectors.

65. A transistor as described in claim 33, and further comprising:
at least two said collectors, said collectors being separated from one another by a distance which is less than the distance separating them from said emitter, said collectors being symmetrically placed with respect to a line bisecting said separation distance between said collectors and joining the center of said emitter means, said line bisecting said impact ionization promotor means and defining a center line of a conductive zone extending from said emitter to said collectors.

66. A transistor as described in claim 34, and further comprising:
at least two said collectors, said collectors being separated from one another by a distance which is less than the distance separating them from said emitter, said collectors being symmetrically placed with respect to a line bisecting said separation distance between said collectors and joining the center of said emitter means, said line bisecting said impact ionization promotor means and defining a center line of a conductive zone extending from said emitter to said collectors.

67. A transistor as described in claim 35, and further comprising:
at least two said collectors, said collectors being separated from one another by a distance which is less than the distance separating them from said emitter, said collectors being symmetrically placed with respect to a line bisecting said separation distance between said collectors and joining the center of said emitter means, said line bisecting said impact ionization promotor means and defining a center line of a conductive zone extending from said emitter to said collectors.

68. A transistor as described in claim 11, and further comprising:
at least two said collectors, said collectors being separated from one another by a distance which is less than the distance separating them from said emitter, said collectors being symmetrically placed with respect to a line bisecting said separation distance between said collectors and joining the center of said emitter means, said line bisecting said impact ionization promotor means and defining a center line of a conductive zone extending from said emitter to said collectors.

69. A transistor as described in claim 5, having an injection efficiency and means for controlling said injection efficiency, comprising:
means for modifying the forward bias potential at said emitter-base junction.

70. A transistor as described in claim 10, having an injection efficiency and means for controlling said injection efficiency, comprising:
means for modifying the forward bias potential at said emitter base junction.

* * * * *